United States Patent
Ramirez-Serrano et al.

(10) Patent No.: US 10,859,981 B1
(45) Date of Patent: *Dec. 8, 2020

(54) VAPOR CELLS HAVING ONE OR MORE OPTICAL WINDOWS BONDED TO A DIELECTRIC BODY

(71) Applicant: Quantum Valley Ideas Laboratories, Waterloo (CA)

(72) Inventors: Jaime Ramirez-Serrano, Waterloo (CA); Hadi Amarloo, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/659,289

(22) Filed: Oct. 21, 2019

(51) Int. Cl.
  *G04F 5/14* (2006.01)
  *G01R 29/08* (2006.01)
  *H01S 1/06* (2006.01)
  *C03C 27/06* (2006.01)

(52) U.S. Cl.
  CPC .............. *G04F 5/145* (2013.01); *C03C 27/06* (2013.01); *G01R 29/0864* (2013.01); *H01S 1/06* (2013.01); *B81C 2203/038* (2013.01)

(58) Field of Classification Search
  CPC ... H03B 17/00; H03L 7/26; G04F 5/14; G04F 5/145; H01S 1/06; B81C 2203/0118; B81C 2203/038
  See application file for complete search history.

(56) References Cited

U.S. PATENT DOCUMENTS

| | | | |
|---|---|---|---|
| 7,645,681 B2 * | 1/2010 | Okada | C03C 27/06 438/455 |
| 8,906,470 B2 | 12/2014 | Overstolz et al. | |
| 8,970,309 B2 * | 3/2015 | Sato | G04F 5/14 331/3 |
| 9,503,021 B2 * | 11/2016 | Hayashi | H03B 17/00 |
| 10,370,760 B2 * | 8/2019 | Jacobs | C23C 16/45525 |
| 10,605,840 B1 | 3/2020 | Amarloo et al. | |
| 2003/0079823 A1 * | 5/2003 | Sabia | H01L 21/76256 156/99 |
| 2005/0007118 A1 | 1/2005 | Kitching et al. | |
| 2016/0218726 A1 | 7/2016 | Overstolz et al. | |

(Continued)

OTHER PUBLICATIONS

Knapkiewicz, Pawel. "Technological assessment of MEMS alkali vapor cells for atomic references." Micromachines 10.1:25, Published Dec. 31 2018. (Year: 2018).*

(Continued)

*Primary Examiner* — Ryan Johnson
(74) *Attorney, Agent, or Firm* — Henry Patent Law Firm PLLC

(57) ABSTRACT

In a general aspect, a vapor cell is presented that includes a dielectric body. The dielectric body has a surface that defines an opening to a cavity in the dielectric body. The vapor cell also includes a vapor or a source of the vapor in the cavity of the dielectric body. An optical window covers the opening of the cavity and has a surface bonded to the surface of the dielectric body to form a seal around the opening. The seal includes metal-oxygen bonds formed by reacting a first plurality of hydroxyl ligands on the surface of the dielectric body with a second plurality of hydroxyl ligands on the surface of the optical window.

28 Claims, 5 Drawing Sheets

(56) References Cited

U.S. PATENT DOCUMENTS

2019/0186007 A1 6/2019 Jacobs et al.
2020/0057116 A1 2/2020 Zorzos et al.

OTHER PUBLICATIONS

Qin, Yiheng, Matiar MR Howlader, and M. Jamal Deen. "Low-temperature bonding for silicon-based micro-optical systems."; Photonics. vol. 2. No. 4. Multidisciplinary Digital Publishing Institute, 2015. (Year: 2015).*
Ye, Jun, Long Sheng Ma, and John L. Hall. "Molecular iodine clock."; Physical review letters; 87.27 (2001): 270801. (Year: 2001).*
Nie, Lei, et al. "Pressure Aided Low Temperature Direct Bonding of Silicon Wafers with High Surface Roughness."; 2006 1st IEEE International Conference on Nano/Micro Engineered and Molecular Systems. IEEE, 2006. (Year: 2006).*
Karlen, Sylvain. "Fabrication and characterization of MEMS alkali vapor cells used in chip-scale atomic clocks and other atomic devices". Diss. Université de Neuchâtel, 2018. (Year: 2018).*
Tong, Qin-Yi, et al. "Low temperature wafer direct bonding.";Journal of Microelectromechanical Systems;3.1 (1994): 29-35. (Year: 1994).*
Chutani, Ravinder; Design, Technology and Packaging of Cesium Vapor Cells for MEMS Atomic Clocks. Diss. 2011. (Year: 2011).*
Wikipedia, "Hydroxide", retrieved from https://en.wikipedia.org/wiki/Hydroxide on Feb. 5, 2020 (Year: 2020).*
Fan, et al., "Atom based RF electric field sensing", Journal of Physics B: Atomic, Molecular and Optical Physics, Sep. 9, 2015, 17 pgs.
Fan, et al., "Effect of Vapor-Cell Geometry on Rydberg-Atom-Based Measurements of Radio-Frequency Electric Fields", Physical Review Applied 4, 044015, 2015, 7 pgs.
Gosele, et al., "Wafer bonding for microsystems technologies", Sensors and Actuators 74, 161-168, 1999, 8 pgs.
Masteika, et al., "A Review of Hydrophilic Silicon Wafer Bonding", ECS Journal of Solid State Science and Technology, 3 (4) Q42-Q54, 2014, 13 pgs.
Sedlacek, et al., "Atom-Based Vector Microwave Electrometry Using Ribidium Rydberg Atoms in a Vapor Cell", Physical Review Letters, Aug. 6, 2013, 5 pgs.
Sedlacek, et al., "Quantum Assisted Electrometry using Bright Atomic Resonances", arXiv:1205.4461v1 [physics.atom-ph], May 20, 2012, 15 pgs.
Suni, et al., "Effects of Plasma Activation on Hydrophilic Bonding of Si and SiO2", Journal of the Electrochemical Society, 149 (6) G348-G351, 2002, 4 pgs.
USPTO, Restriction Requirement dated Jan. 10, 2020, in U.S. Appl. No. 16/659,276, 6 pgs.
USPTO, Non-Final Office Action dated Apr. 30, 2020, in U.S. Appl. No. 16/659,276, 20 pgs.
USPTO, Final Office Action dated Jun. 22, 2020, in U.S. Appl. No. 16/659,276, 13 pgs.
WIPO, International Search Report and Written Opinion dated Oct. 9, 2020, in PCT/CA2020/051009, 9 pgs.
Li, et al., "Low temperature Si/Si wafer direct bonding using a plasma activated method", Journal of Zhejiang University-Sci C (Comput & Electron) 14(4):244-251, 2013, 8 pgs.

\* cited by examiner

VAPOR CELLS HAVING ONE OR MORE OPTICAL WINDOWS BONDED TO A DIELECTRIC BODY

BACKGROUND

The following description relates to vapor cells and their methods of manufacture.

Vapor cells are manufactured by sealing a vapor or gas within an enclosed volume. To introduce the vapor or gas into the enclosed volume, a vapor cell may include a delivery tube formed of glass, called a stem, that is fused-off when sufficient vapor or gas has entered the enclosed volume. The fused-off delivery tube, however, projects from the vapor cell, making the vapor cell fragile, awkward to package, and may also perturb electric fields measured by the vapor cell. Vapor cells are also commonly manufactured using an anodic bonding process. The anodic bonding process requires high temperatures and voltages and may outgas volatile species during bond formation. The high temperatures prevent anti-relaxation coatings from being applied to the vapor cell, and the volatile species may contaminate the vapor or gas in the vapor cell. Vapor cells and methods of manufacture are desired that avoid or mitigate these shortcomings.

DETAILED DESCRIPTION

Figure 1A:
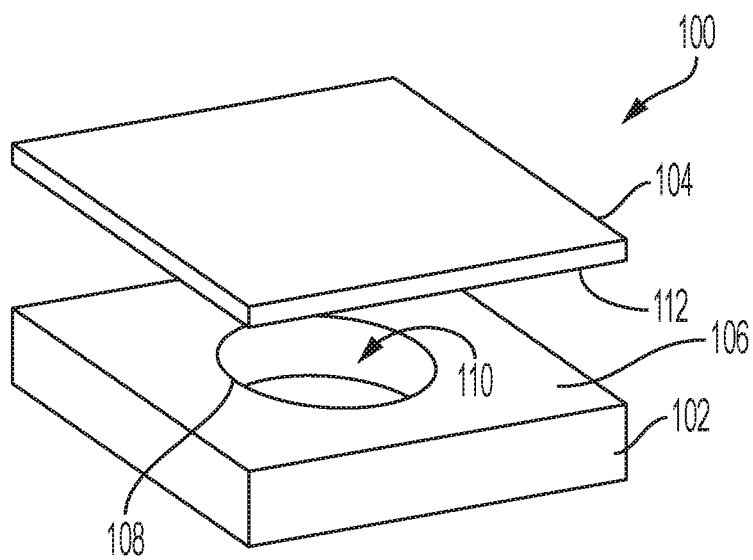
FIG. 1A is an exploded view, in perspective, of an example vapor cell having a dielectric body and an optical window.

Many applications in atom-based sensing require stemless, small vapor cells with high purity gas samples inside them. These types of vapor cells are challenging to manufacture in large numbers, especially when the vapor cells require well-controlled pure samples of atoms or molecules. Currently, the best vapor cells for such applications are made using anodic bonding, which requires high temperatures and high voltages. However, during the anodic bonding process, outgassing often takes place in the vapor cell, introducing volatile contaminants into the vapor inside. Such contaminants may reduce the performance of vapor cells during atom-based sensing applications. Moreover, the high temperatures and voltages associated with anodic bonding also prevent anti-relaxation coatings from being applied to the vapor cells.

It is also undesirable to have a stem on vapor cells for many applications such as magnetometry, time sensing, and atom-based electric field sensing. The stem makes the vapor cell fragile, awkward to package, and perturbs the electromagnetic field to be measured. For atom-based sensing of electromagnetic fields, it is important to have the size of the vapor cell much smaller than a wavelength of the electromagnetic field to be detected. The presence of a stem hinders the miniaturization of vapor cells to dimensions smaller than wavelengths of electromagnetic fields to be detected. Furthermore, it is desirable for the vapor cells to be manufactured so that they allow the transmission of light into the cavity containing the atoms and/or molecules.

Small vapor cells without stems that can hold pure samples of atoms or molecules are important to atom and molecule-based sensing. Applications such as atomic clocks and sensors based on vapor cells can allow room temperature operation of useful metrological devices that are self-calibrated and whose performance can surpass conventional devices. As the world becomes more standardized and connected these types of instruments become increasingly important as the demands placed on the precision and accuracy of electromagnetic field sensing and timing grows. For example, field calibration of radar systems through over-the-air testing requires standard measurements that usually take place in large test facilities. Clocks and accelerometers that can meet the demanding applications of GPS for GPS-denied areas as well as handle GPS dropouts can benefit from such vapor cells. Current coherent population trapping (CPT) atomic clocks operate with large amounts of buffer gas that make it possible to use anodic bonding to seal the vapor cells used in these applications. However, pure vapor samples of alkali atoms can enable other kinds of devices including different types of clocks. For example, vapor cell magnetometers that require spin-preserving, anti-relaxation coatings are another application of this vapor cell preparation method.

In some aspects of what is described here, vapors cells for atom-based sensing are presented, including their methods of manufacture. In many variations, the vapor cells are small (e.g., less than 1 mm³) and stemless. However, larger vapor cells with variable geometry are also possible. The vapor cells may be sufficiently small, when compared to a wavelength of electromagnetic fields measured by the vapor cells, that their scattering cross-section is reduced below a geometric cross-section. The lack of a stem may also reduce the scattering cross-section as well as reducing a distortion of the measured electromagnetic fields. The methods of manufacture are capable of producing such vapor cells. The methods may be based on fabricating arrays of stemless vapor cells on large substrates and then cutting out the vapor cells with either a dicing saw or laser. However, the methods may also be based on individual chips that correspond to a single stemless vapor cell.

In the methods, a frame is prepared that can be pumped out to low pressure (e.g., less than $10^{-9}$ Torr). The frame may be fabricated by making cavities or holes in a substrate. If holes are made, an optical window or backing can be bonded with a strong, high temperature bond such as an anodic bond or glass frit bond. Outgassing in such operations does not affect the vapor cell because the openings are not sealed and thus contaminant gases can escape. To seal a high purity gas in the vapor cell, the methods produce a contact bond in a background environment of the pure gas. The contact bond can also be formed in pure vacuum if a filling operation is performed, e.g., dotting a cavity or holes in the frame with an alkali metal, inserting a vaporizable source of alkali atoms in the cavity or holes, and so forth.

The contact bond to seal the vapor cell works by chemically activating the surfaces of the frame and the optical window using a plasma. Such activation may be supplemented with a wash to create hydroxyl bonds (e.g., bonds to OH chemical groups), which eventually form metal-oxygen bonds between the frame and window/cover. For example, if the frame is formed of silicon oxide (e.g., vitreous silica, single-crystal quartz, etc.) and the optical window is a glass that includes silicon oxide, the metal-oxygen bonds may include siloxane bonds (i.e., Si—O—Si). Siloxane contact bonding works well with frames and optical windows that include silicon oxide. However, other materials may be possible if coated with a layer of silicon oxide. For example, the front surface of a silicon frame may be coated with a layer of silicon oxide (e.g., $SiO_2$, $SiO_x$, etc.) to facilitate a contact bond between the optical window and the frame. After contact bonding, the vapor cell can be easily fiber coupled by attaching a fiber to the window(s) directly or attaching a GRIN lens attached to a fiber to the vapor cell. Such coupling may allow the vapor cell to function as a sensor for sensing of electromagnetic fields.

Figure 1B:
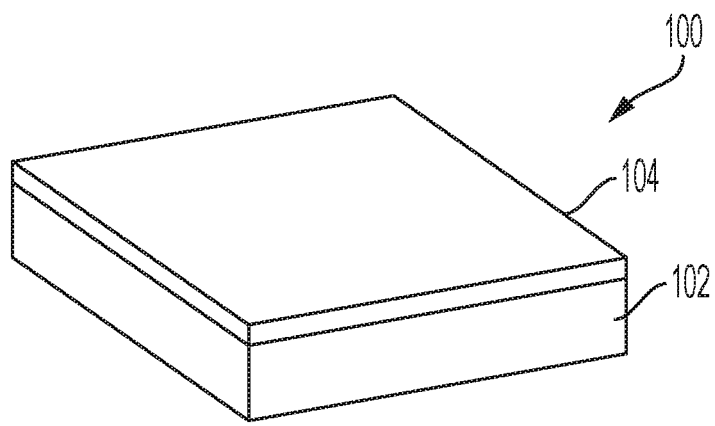
FIG. 1B is a perspective view of the example vapor cell of FIG. 1A, but in which the optical window is contact-bonded to the dielectric body.

Now referring to FIG. 1A, an exploded view is presented, in perspective, of an example vapor cell 100 having a dielectric body 102 and an optical window 104. FIG. 1B presents the example vapor cell 100 of FIG. 1A, but in which the optical window 104 is contact-bonded to the dielectric body 102. The example vapor cell 100 is stemless, and in many variations, is less than 1 mm³ in size. The dielectric body 102 may be a substrate defined by opposing planar surfaces, as shown in FIGS. 1A-1B. However, other configurations are possible for the dielectric body 102. Moreover, although FIGS. 1A-1B depict the dielectric body 102 as being square, other shapes are possible. The optical window 104 may also be a substrate defined by opposing planar surfaces. However, other configurations are possible for the optical window 104. In general, the optical window 104 includes one surface adapted to mate (or bond) against a surface of the dielectric body 102, thereby allowing a seal to form (e.g., via a contact bond).

The dielectric body 102 may be formed of a material transparent to electric fields (or electromagnetic radiation) measured by the vapor cell 100. The material may be an insulating material having a high resistivity, e.g., $\rho > 10^8$ $\Omega \cdot cm$, and may also correspond to a single crystal, a polycrystalline ceramic, or an amorphous glass. For example, the dielectric body 102 may be formed of silicon. In another example, the dielectric body 102 may be formed of a glass that includes silicon oxide (e.g., $SiO_2$, $SiO_x$, etc.), such as vitreous silica, a borosilicate glass, or an aluminosilicate glass. In some instances, the material of the dielectric body 102 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In other instances, the material of the dielectric body 102 is a non-oxide material such as silicon (Si), diamond (C), gallium nitride (GaN), calcium fluoride (CaF), and so forth. In these instances, an adhesion layer may be disposed on the dielectric body 102 to define the surface 106 of the dielectric body 102. The adhesion layer may be capable of bonding to the non-oxide material of the dielectric body 102 while also being capable of forming a contact bond with the optical window 104. For example, the dielectric body 102 may be formed of silicon and the example vapor cell 100 may include an adhesion layer that includes silicon oxide (e.g., $SiO_2$, $SiO_x$, etc.) on the dielectric body 102. This adhesion layer defines the surface 106 of the dielectric body 102 and is capable of forming siloxane bonds when processed according the methods of manufacture described herein.

The dielectric body 102 includes a surface 106 that defines an opening 108 to a cavity 110 in the dielectric body 102. The surface 106 may be a planar surface, as shown in FIGS. 1A-1B, although other surfaces are possible (e.g., curved). The opening 108 may be any type of opening that allows access to an internal volume of the cavity 110 and may have any shape (e.g., circular, square, hexagonal, oval, etc.). Such access may allow a vapor (or a source of the vapor) to be disposed into the cavity 110 during manufacture of the vapor cell 100. The cavity 110 extends from the surface 106 into the dielectric body 104 and stops before extending completely through the dielectric body 104. The cavity 110 may have a uniform cross-section along its extension through the dielectric body. However, in some variations, the cross-section of cavity 110 may vary along its extension.

The example vapor cell 100 includes a vapor (not shown) in the cavity 110 of the dielectric body 102. The vapor may include constituents such as a gas of alkali-metal atoms, a noble gas, a gas of diatomic halogen molecules, or a gas of organic molecules. For example, the vapor may include a gas of alkali-metal atoms (e.g., K, Rb, Cs, etc.), a noble gas (e.g., He, Ne, Ar, Kr, etc.), or both. In another example, the vapor may include a gas of diatomic halogen molecules (e.g., $F_2$, $Cl_2$, $Br_2$, etc.), a noble gas, or both. In yet another example, the vapor may include a gas of organic molecules (e.g., acetylene), a noble gas, or both. Other combinations for the vapor are possible, including other constituents.

The example vapor cell 100 may also include a source of the vapor in the cavity 110 of the dielectric body 102. The source of the vapor may generate the vapor in response to an energetic stimulus, such as heat, exposure to ultraviolet radiation, and so forth. For example, the vapor may correspond to a gas of alkali-metal atoms and the source of the vapor may correspond to an alkali-metal mass sufficiently cooled to be in a solid or liquid phase when disposed into the cavity 110. In some implementations, the source of the vapor resides in the cavity of the dielectric body, and the source of the vapor includes a liquid or solid source of the alkali-metal atoms configured to generate a gas of the alkali-metal atoms when heated.

The example vapor cell 100 additionally includes the optical window 104. As shown in FIG. 1B, the optical window 104 covers the opening 108 of the cavity 110 and has a surface 112 bonded to the surface 106 of the dielectric body 102. This bonding forms a seal around the opening 108. The seal includes metal-oxygen bonds formed by reacting a first plurality of hydroxyl ligands on the surface 106 of the dielectric body 102 with a second plurality of hydroxyl ligands on the surface 112 of the optical window 104. If one or both of the dielectric body 102 (or an adhesion layer thereon) and the optical window 104 include silicon oxide, the metal-oxide bonds may include siloxane bonds (i.e., Si—O—Si). However, other types of metal-oxygen bonds are possible, including hybrid oxo-metal bonds. For example, if the dielectric body 102 and the optical window are both formed of sapphire (e.g., $Al_2O_3$), the metal-oxygen bonds may include oxo-aluminum bonds (e.g., Al—O—Al). If the dielectric body 102 is formed of a glass that includes silicon oxide and the optical window 104 is formed of sapphire, the metal-oxygen bonds may include silicon-oxo-aluminum bonds (e.g., Si—O—Al, Al—O—Si, etc.).

The optical window 104 may be formed of a material transparent to electromagnetic radiation (e.g., laser light) used to probe the vapor sealed within the cavity 110 of the dielectric body 102. For example, the material of the optical window 104 may be transparent to infrared wavelengths of electromagnetic radiation (e.g., 700-1000 nm), visible wavelengths of electromagnetic radiation (e.g., 400-7000 nm), or ultraviolet wavelengths of electromagnetic radiation (e.g., 10-400 nm). Moreover, the material of the optical window 104 may be an insulating material having a high resistivity, e.g., $\rho > 10^8$ $\Omega \cdot cm$, and may also correspond to a single crystal, a polycrystalline ceramic, or an amorphous glass. For example, the material of the optical window 104 may include silicon oxide (e.g., $SiO_2$, $SiO_x$, etc.), such as found within quartz, vitreous silica, or a borosilicate glass. In another example, the material of the optical window 104 may include aluminum oxide (e.g., $Al_2O_3$, $Al_xO_y$, etc.), such as found in sapphire or an aluminosilicate glass. In some instances, the material of the optical window 104 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In other instances, the material is a non-oxide material such as diamond (C), calcium fluoride (CaF), and so forth.

In many implementations, the surface 106 of the dielectric body 102 and the surface 112 of the optical window 104 may have a surface roughness $R_a$, no greater than a threshold surface roughness. The threshold surface roughness may ensure that, during contact bonding, pathways are not formed that leak through the seal. Such pathways, if present, might allow contaminates to enter the cavity 110 and vapor to exit the vapor cell 100. In some variations, the threshold surface roughness is less than 50 nm. In some variations, the threshold surface roughness is less than 30 nm. In some variations, the threshold surface roughness is less than 10 nm. In some variations, the threshold surface roughness is less than 1 nm.

Figure 2A:
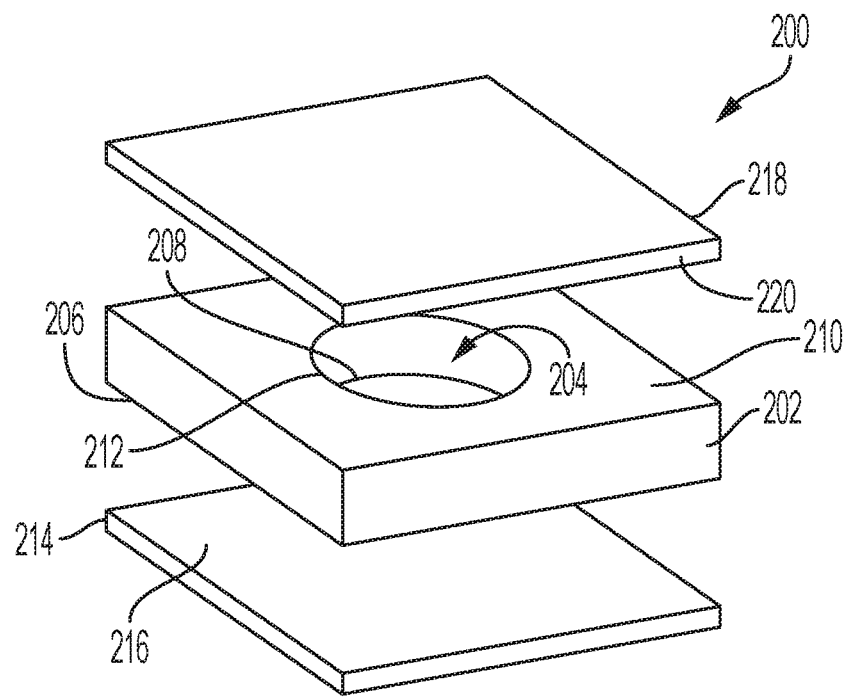
FIG. 2A is an exploded view, in perspective, of an example vapor cell having two optical windows.
Figure 2B:
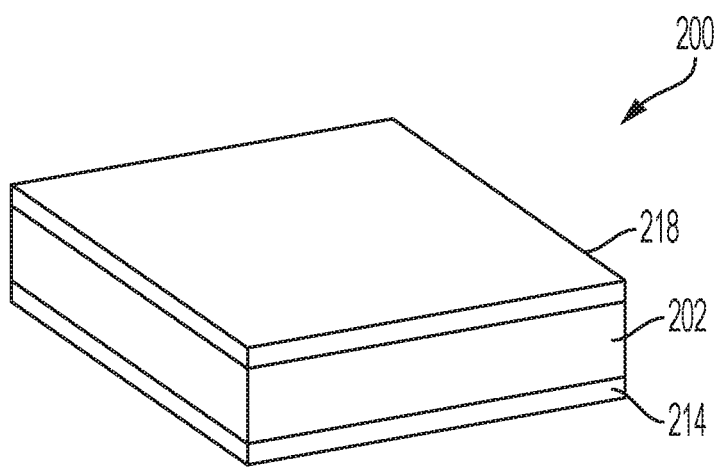
FIG. 2B is a perspective view of the example vapor cell of FIG. 2A, but in which both optical windows are bonded to a dielectric body of the example vapor cell.

Although FIGS. 1A and 1B depict the example vapor cell 100 as having a single optical window, two or more optical windows are possible for the example vapor cell 100. Moreover, in some variations, the cavity 110 may extend entirely through dielectric body 102. FIG. 2A presents an exploded view, in perspective, of an example vapor cell 200 having two optical windows. The example vapor cell 200 may be analogous in many features to the example vapor cell 100 shown by FIGS. 1A-1B. FIG. 2B presents the example vapor cell 200 of FIG. 2A, but in which both optical windows are bonded to a dielectric body 202 of the example vapor cell 200. At least one of the bonds is a contact bond, such as described in relation to the example vapor cell 100 of FIGS. 1A-1B. The example vapor cell 200 includes the dielectric body 202 and a cavity 204 in the dielectric body 202. The cavity 204 extends completely through the dielectric body 202. A first surface 206 of the dielectric body 202 defines a first opening 208 to the cavity 204, and a second surface 210 of the dielectric body 202 defines a second opening 212 to the cavity 204.

The example vapor cell 200 also includes a first optical window 214 covering the first opening 208 of the cavity 204. The first optical window 214 has a surface 216 bonded to the first surface 206 of the dielectric body 202 to form a first seal around the first opening 208. The example vapor cell 200 additionally includes a second optical window 218 covering the second opening 212 of the cavity 204. The second optical window 218 has a surface 220 bonded to the second surface 210 of the dielectric body 202 to form a second seal around the second opening 212. The second seal includes metal-oxygen bonds formed by reacting a first plurality of hydroxyl ligands on the second surface 210 of the dielectric body 202 with a second plurality of hydroxyl ligands on the surface 220 of the second optical window 218. A vapor or a source of the vapor (not shown) resides in the cavity 204 of the dielectric body 202.

The dielectric body 202 and the optical windows 214, 218 may share features in common with, respectively, the dielectric body 102 and the optical window 104 described in relation to the example vapor cell 100 of FIGS. 1A-1B. For example, the dielectric body 202 may be formed of silicon (Si), aluminum oxide (e.g., $Al_2O_3$), or a glass that includes silicon oxide (e.g., $SiO_2$, $SiO_x$, etc.). In another example, one or both of first and second optical windows 214, 218 may be formed of a material transparent to electromagnetic radiation (e.g., laser light) used to probe the vapor sealed within the cavity 204 of the dielectric body 202. Other features and their combinations are possible. Similarly, the vapor and the source of the vapor may share features in common with, respectively, the vapor and the source of the vapor described in relation to the example vapor cell 100 of FIGS. 1A-1B. For example, the vapor may include a gas of alkali-metal atoms, a noble gas, a gas of diatomic halogen molecules, a gas of organic molecules, or some combination thereof. In another example, the source of the vapor may reside in the cavity 204 of the dielectric body 202, and the source of the vapor may include a liquid or a solid source of alkali-metal atoms configured to generate a gas of the alkali-metal atoms when heated. Other features and their combinations are possible.

In implementations where the dielectric body 202 is formed of a non-oxide material, an adhesion layer may be disposed on the dielectric body 202 to define the second surface 210 of the dielectric body 202. The adhesion layer may be capable of bonding to the non-oxide material of the dielectric body 202 while also being capable of forming a contact bond with the surface 220 of the second optical window 218. For example, the dielectric body 202 may be formed of silicon and the example vapor cell 200 may include an adhesion layer that includes silicon oxide (e.g., $SiO_2$, $SiO_x$, etc.) on the dielectric body 202. This adhesion layer defines the second surface 210 of the dielectric body 202 and is capable of forming siloxane bonds when processed according the methods of manufacture described herein. In some implementations, the first seal comprises metal-oxygen bonds formed by reacting a third plurality of hydroxyl ligands on the first surface 206 of the dielectric body 202 with a fourth plurality of hydroxyl ligands on the surface 216 of the first optical window 214. In these implementations, example vapor cell 200 may include an adhesion layer disposed on the dielectric body 202 to define the first surface 206 of the dielectric body 202 if the dielectric body is formed of a non-oxide material.

In some implementations, such as shown in FIGS. 2A-2B, the first and second surfaces 206, 210 of the dielectric body 202 are planar surfaces opposite each other, and the surface 216 of the first optical window 214 and the surface 220 of the second optical window 218 are planar surfaces. In some implementations, the second surface 210 of the dielectric body 202 and the surface 220 of the second optical window 218 have a surface roughness, $R_a$, no greater than a threshold surface roughness. In some variations, the threshold surface roughness is less than 50 nm. In some variations, the threshold surface roughness is less than 30 nm. In some variations, the threshold surface roughness is less than 10 nm. In some variations, the threshold surface roughness is less than 1 nm. In further implementations, the threshold surface roughness is a second threshold surface roughness, and the first surface 206 of the dielectric body 202 and surface 216 of the first optical window 214 have a surface roughness, $R_a$, no greater than a first threshold surface roughness. The first threshold surface roughness need not be the same as the second threshold surface roughness.

In some implementations, the first seal includes an anodic bond between the first surface 206 of the dielectric body 202 and the surface 216 of the first optical window 214. In some implementations, the dielectric body 202 is formed of a glass comprising silicon oxide (e.g., $SiO_2$, $SiO_x$, etc.) and the first optical window 214 includes silicon oxide (e.g., $SiO_2$, $SiO_x$, etc.). In these implementations, the example vapor cell 200 includes a layer of silicon disposed between the first surface 206 of the dielectric body 202 and the surface 216 of the first optical window 214. The first seal includes an anodic bond between the layer of silicon and one or both of the first surface 206 of the dielectric body 202 and the surface 216 of the first optical window 214.

In some implementations, the dielectric body 202 is formed of a glass comprising silicon oxide (e.g., $SiO_2$, $SiO_x$, etc.) and the first optical window 214 includes silicon oxide (e.g., $SiO_2$, $SiO_x$, etc.). In such cases, the example vapor cell 200 includes a fired layer of glass frit bonding the first surface 206 of the dielectric body 202 to the surface 216 of the first optical window 214. The fired layer of glass frit defines the first seal.

Figure 3:
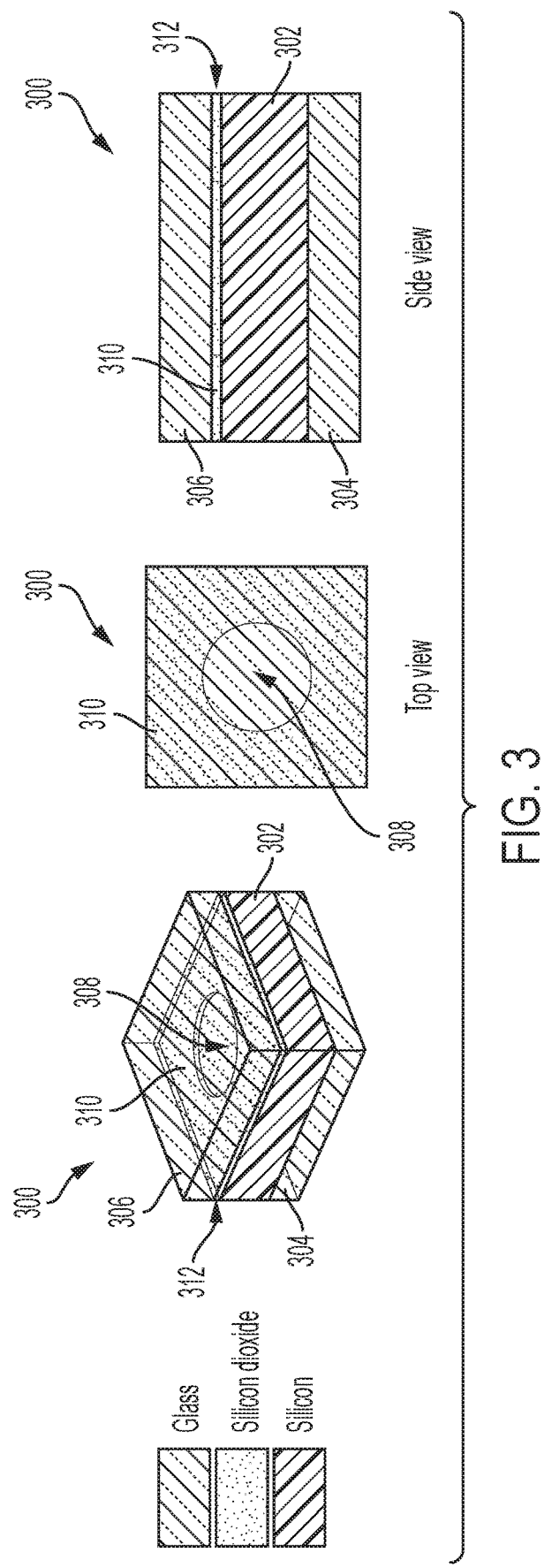
FIG. 3 is an example vapor cell, shown from perspective, top, and side views, that has a dielectric body formed of silicon and two optical windows formed of glass.

FIG. 3 presents an example vapor cell 300, shown from perspective, top, and side views, that has a dielectric body 302 formed of silicon and two optical windows 304, 306 formed of glass. The example vapor cell 300 may be a single vapor cell, or alternatively, be part of an array of such cells (e.g., manufactured using large substrates or wafers). The glass includes silicon oxide, although a composition of the glass may be the same or different for the two optical windows 304, 306. The two optical windows 304, 306 cover respective openings to a cavity 308 in the dielectric body 302. In particular, a first optical window 304 is bonded to the dielectric body 302 to define a first seal, and a second optical window 306 is bonded to the dielectric body 302 to define a second seal. The first and second seals assist in containing a vapor (or a source of the vapor) within the cavity 308 of the dielectric body 302. An adhesion layer 310 is disposed along an interface 312 between the second optical window 306 and the dielectric body 302. The adhesion layer 310 is formed of silicon dioxide (e.g., single-crystal quartz or vitreous silica) and allows a contact bond between the dielectric body 302 and the second optical window 306. The contact bond helps to define the second seal and includes siloxane bonds (i.e., Si—O—Si) between the adhesion layer 310 and the second optical window 306. The first seal may include an anodic bond between the dielectric body 302 and the first optical window 304. Alternatively, a fired layer of glass frit may bond the dielectric body 302 to the first optical window 304 to form the first seal.

Figure 4:
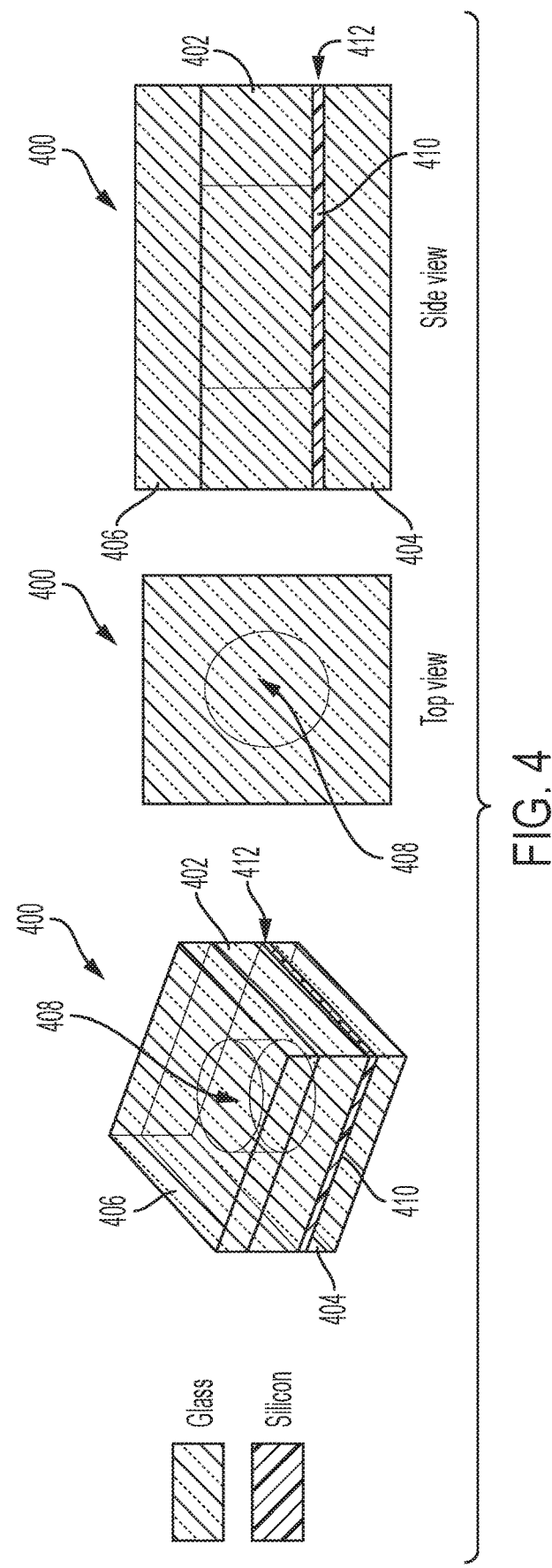
FIG. 4 is an example vapor cell, shown from perspective, top, and side views, that has a dielectric body formed of glass and two optical windows formed of glass.

FIG. 4 presents an example vapor cell 400, shown from perspective, top, and side views, that has a dielectric body 402 formed of glass and two optical windows 404, 406 formed of glass. Similar to FIG. 3, the example vapor cell 400 may be a single vapor cell, or alternatively, be part of an array of such cells (e.g., manufactured using large substrates or wafers). The glass includes silicon oxide, although a composition of the glass may be the same or different for any combination of the dielectric body 402 and the two optical windows 404, 406. The two optical windows 404, 406 cover respective openings to a cavity 408 in the dielectric body 402. In particular, a first optical window 404 is bonded to the dielectric body 402 to define a first seal, and a second optical window 406 is bonded to the dielectric body 402 to define a second seal. The first and second seals assist in containing a vapor (or a source of the vapor) within the cavity 408 of the dielectric body 402. A layer of silicon 410 is disposed along an interface 412 between the first optical window 404 and the dielectric body 402. The layer of silicon 410 allows an anodic bond between the first optical window 404 and the dielectric body 402, which helps to define the first seal. A contact bond defines the second seal and includes siloxane bonds (i.e., Si—O—Si) between the dielectric body 402 and the second optical window 406.

Figure 5A:
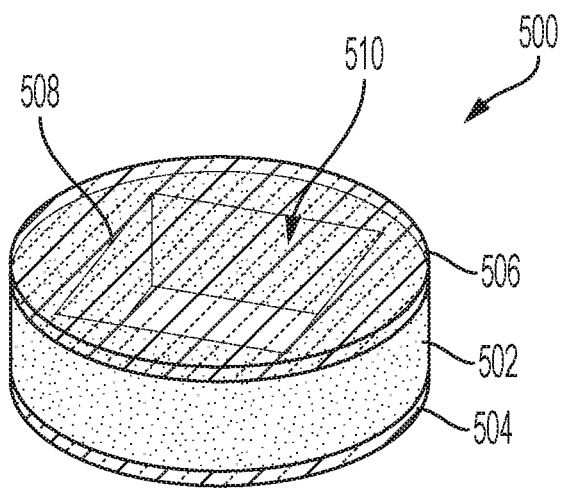
FIG. 5A is a perspective view of an example vapor cell that includes a circular dielectric body and a cavity defined by a square outer wall and a circular inner wall of the circular dielectric body.
Figure 5B:
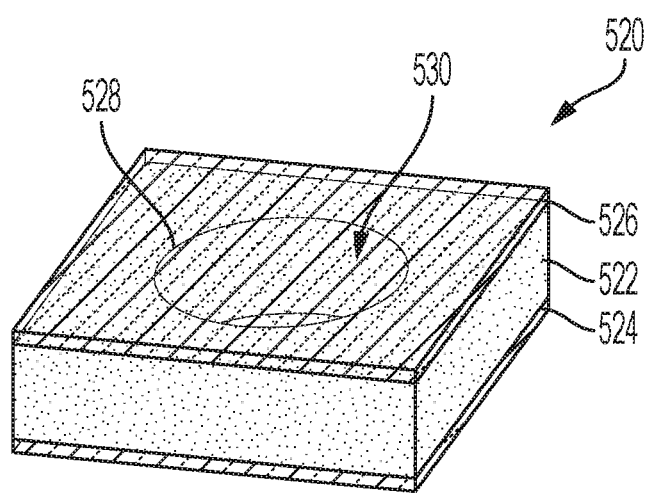
FIG. 5B is a perspective view of an example vapor cell that includes a square dielectric body and a cavity is defined by circular outer and inner walls of the square dielectric body.
Figure 5C:
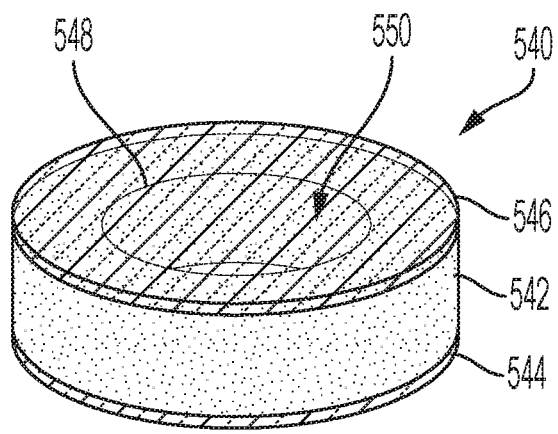
FIG. 5C is a perspective view of an example vapor cell that includes a circular dielectric body and a cavity defined by circular outer and inner walls of the circular dielectric body.

Although FIGS. 1A-4 depict square vapor cells with circular cavities, other geometries are possible for the vapor cells and their respective cavities. For example, FIGS. 5A-5C present, in perspective view, alternative geometries for example vapor cells 500, 520, 540. In FIG. 5A, the example vapor cell 500 includes a circular dielectric body 502 and circular optical windows 504, 506. The circular dielectric body 502 includes a square wall 508 to define a cavity 510 therein. In some variations, the circular dielectric body 502 is formed of silicon and may be about 0.5 mm thick. A diameter of the circular dielectric body 502 may be about 1.5 mm. In some variations, the circular optical windows 504, 506 may be about 0.05 mm-0.30 mm thick. The circular optical windows 506, 506 may share a diameter in common with the circular dielectric body 502. In some variations, the square wall 508 may have an edge length of about 0.9 mm.

In FIG. 5B, the example vapor cell 520 includes a square dielectric body 522 and square optical windows 524, 526. The square dielectric body 522 includes a circular wall 528 to define a cavity 530 therein. In some variations, the square dielectric body 522 is formed of silicon and may be about 0.5 mm thick. An edge length of the square dielectric body 522 may be about 1.5 mm. In some variations, the square optical windows 524, 526 may be about 0.05 mm-0.30 mm thick. The square optical windows 524, 526 may share an edge length in common with the square dielectric body 522. In some variations, the circular wall 528 may have a diameter of about 0.9 mm.

In FIG. 5C, the example vapor cell 540 includes a circular dielectric body 542 and circular optical windows 544, 546. The circular dielectric body 542 includes circular wall 548 to define a cavity 550 therein. In some variations, the circular dielectric body 542 is formed of silicon and may be about 0.5 mm thick. A diameter of the circular dielectric body 542 may be about 1.5 mm. In some variations, the circular optical windows 544, 546 may be about 0.05 mm-0.30 mm thick. The circular optical windows 544, 546 may share a diameter in common with the circular dielectric body 542. In some variations, the circular wall 548 may have a diameter of about 0.9 mm.

The vapor cells described in relation to FIGS. 1A-5C can be manufactured using the methods described herein. The methods of manufacture can produce vapor cell sizes much smaller than a wavelength of electromagnetic radiation to be detected or measured. For atom-based magnetometry, the methods may include a low temperature method for sealing the vapor cells that allows the vapor cells to be coated with anti-relaxation coatings. The methods include constructing a frame or body of vapor cells using laser machining or a lithographic technique, followed by an etching method such as deep reactive ion etching (DRIE) to make individual structures or many structures on a chip. Materials used for the frame (e.g., silicon) are coated prior to chemical or laser machining, such as with a silicon oxide material (e.g., $SiO_2$, $SiO_x$, etc.) or another adhesion layer. Next, an optical window that can transmit the desired electromagnetic waves is anodically bonded to the frame (or bonded in some other way, such as glass frit bonding). This bonding operation produces a strong bond that is leak-tight for high vacuum. However, in certain cases, the anodic bonding operation may also produce outgassing. For example, in methods such as those used to construct chip-scale atomic clocks, anodic bonding is used to fasten optical windows onto a frame or body. In these methods, a large amount of outgassing may occur because of the relatively high temperatures and high voltages required, which in turn, strongly drives ion diffusion. The outgassing causes the pressure of unwanted gases in the vapor cell to rise to unacceptably high levels, which may degrade the performance of the vapor cell.

To help avoid or mitigate outgassing, the methods presented herein produce a seal using a contact-bonding operation. In the contact-bonding operation, an adhesion layer and optical window may be prepared using plasma activation. In some variations, a frame or body with an optical window is placed in an atmosphere of a gas, thereby allowing the gas to fill the vapor cell(s) to a desired pressure. A contact bond is then made by pressing the plasma activated sides of the pieces together to form the seal. Other filling techniques, however, are possible. For example, an alkali metal mass may be dotted onto an anodically-bonded window and then sealed under high vacuum conditions in the vapor cell with a contact-bonding operation. Alternatively, a various laser-activated source of a vapor of gas may be placed in the vapor cell and then sealed under high vacuum conditions by a contact-bonding operation. The methods presented herein are well-suited for producing vapor cells coated with anti-relaxation coatings for magnetometry since the contact-bonding operation, which may correspond to a final operation, occurs at low temperatures.

The methods of manufacturing described herein can fabricate stemless vapor cells with high purity gas samples by combining strong bonding methods (e.g., anodic bonding in atmosphere) with contact bonding in vacuum. The methods are conducive for large scale manufacturing because many vapor cells can be made at the same time on a large substrate (e.g., a wafer) and then cut out using either a laser machining process or a dicing saw. In some variations, the vapor cells have dielectric bodies formed of silicon or a glass that includes silicon oxide (e.g., $SiO_2$, $SiO_x$, etc.). The dielectric body is machined either chemically or with a laser to create cavities for the filling vapor. If the cavities created pass through the dielectric body, then a first optical window is anodically bonded to one side of the dielectric body. It is unnecessary to anodically bond the first optical window if the hole does not pass through the frame. Glass frit bonding or another type of bonding may be used for the first optical window. Anodic bonding works well for glass to silicon bonds, and glass frit bonding works well for glass on glass bonds.

In certain of the methods, the dielectric body is prepared with a thin layer (e.g., about 500 nm) of silicon oxide (e.g., $SiO_2$, $SiO_x$, etc.) when formed of silicon so that a contact bond can be made between an optical window (or a second optical window) and the dielectric body. The dielectric body may also be prepared with the thin layer of silicon oxide if formed of another material similar to silicon (e.g., a non-oxide material). Following this preparation, a contact bond is made in a pure atmosphere of the vapor or gas that fills the vapor cell (e.g., a gas of alkali-metal atoms that includes cesium or rubidium). In many implementations, the contact bond is done at low temperatures (e.g., less than 100° C.) and zero applied voltage to prevent outgassing of undesirable gasses into the cavity of the vapor cell.

The contact bond is formed using metal-oxygen bonding between a surface of the dielectric body and a mating surface of an optical window. For variations in which the dielectric body is formed of silicon (or a glass that includes silicon oxide), and the optical window is formed of glass that includes silicon oxide, the contact bonding may be formed using siloxane bonds (i.e., Si—O—Si). A reaction of the contact-bond formation process may be represented by:

Si—OH+HO—Si⇌Si—O—Si+H$_2$O

The reaction is reversible, so in some instances, it is desirable to remove the water molecules generated from the reaction. Otherwise, the newly-formed siloxane bonds are at risk in being hydrolyzed back into silanol bonds (i.e., Si—OH).

Water molecules generated by contact-bonding can be removed by reactions whose products are solid at room temperature. In some implementations, the water molecules are reacted with the vapor in the vapor cell. For example, the vapor may be a gas of cesium atoms, and the water molecules may be reacted with a portion of the gas to form solids, such as $Cs_2O$ ($T_{melt}$≅340° C.), CsOH ($T_{melt}$≅272° C.), or CsH ($T_{melt}$≅170° C.). In some implementations, the water molecules are reacted with a desiccant material that resides in the cavity of the dielectric body (e.g., as a coating, a dotted mass, etc.). The desiccant material may be inert to the vapor in the vapor cell. For example, the vapor may be a gas of diatomic halogen molecules (e.g., chlorine gas), and the water molecules may be reacted with an anhydrous chloride salt (e.g., $LaCl_3$) to form products, such as hydrated salts or oxyhydroxide compounds (e.g., $LaCl_3 \cdot xH_2O$, LaOCl, etc.).

Although the representative reaction is presented in the context of silicon as the participating metal atoms, other metal atoms are possible. For example, if the dielectric body is formed of aluminum oxide (e.g., single-crystal sapphire) and the optical window is also formed of aluminum oxide (e.g., $Al_2O_3$ polycrystalline ceramic), the contact-bond formation process may utilize aluminum as the metal atom and form oxo-aluminum bonds (e.g., Al—O—Al). Mixtures of metals are also possible. For example, if the dielectric body is formed of zirconium oxide and the optical window is formed of magnesium oxide, the contact-bond formation process may utilize zirconium and magnesium as the metal atoms and form zirconium-oxo-magnesium bonds.

In general, for a dielectric body formed of a material that includes a first metal, $M_1$, and an optical window formed of a material that includes a second metal, $M_2$, a reaction of the contact-bond formation process may be represented by:

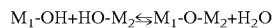
M$_1$-OH+HO-M$_2$⇌M$_1$-O-M$_2$+H$_2$O

Here, a hydroxyl ligand (i.e., OH) is coordinated to each of the metal atoms, $M_1$ and $M_2$, and the hydroxyl ligands condense into an oxo ligand (O) during formation of the metal-oxygen bond (i.e., $M_1$-O-$M_2$). A water molecule is liberated as a by-product of this condensation process. Although the reaction suggests a single hydroxyl ligand per metal atom, other numbers of hydroxyl ligands may be coordinated to each of the metal atoms, $M_1$ and $M_2$.

In many variations, the condensation of hydroxyl ligands occurs at room temperature upon contact of a surface of the dielectric body with a mating surface of the optical window. However, in some variations, heat may be applied to initiate and/or complete the formation of the contact bond. The heat may also strengthen the contact bond. For example, heat may be applied to one or both of the dielectric body and the optical window to increase their respective temperatures to a processing temperature. The processing temperature may facilitate formation of the contact bond. In some variations, the processing temperature is no greater than 250° C. In some variations, the processing temperature is no greater than 120° C. In some variations, the processing temperature is no greater than 75° C.

After the contact bond is formed, the vapor cell can abe coated with a material to protect the vapor cell such as parylene or an epoxy. The vapor cell can also be fiber coupled by attaching a fiber to the window(s) either directly or with a GRIN lens.

As described above, the methods of manufacture allow the construction of small, stemless vapor cells that can be used for atom-based sensing. Such sensors may be used for metrological purposes. A sub-wavelength vapor cell for sensing MHz to THz electromagnetic fields reduces a physical cross-section for the scattering of electromagnetic fields measured by the vapor cell. The cross-section scales like the ratio of the vapor cell dimensions divided by lambda to the third power. (Lambda corresponds to a wavelength of electromagnetic radiation measured by the vapor cell.) Moreover, stems of vapor cells that contain vapor (e.g. a gas of alkali-metal atoms) can cause a distortion of the measured electromagnetic fields. Vapor cells that lack stems thus offer improved measurement capabilities relative to conventional vapor cells, which include stems. Stemless vapor cells are also conducive for chip-scale devices that utilize atom-based sensing.

The methods of manufacture also allow multiple vapor cells to be connected together or arranged in an array to make multiple simultaneous measurements in a region of space. For example, they could be arranged in a planar array so that an electromagnetic field could be characterized in the sensor plane. 3-dimensional arrays are also possible. These features are enabled by the dielectric nature of the probes since the vapor cells minimally interact with each other—they have low scattering cross-sections. The light can be transported to the vapor cells through optical waveguides, such as fiber, in parallel or series, but have to be readout independently (the signal light has to be split off at each vapor cell to give a measurement that reflects the absorption or dispersive signal associated with the individual vapor cell). In essence, this is a multipixel array, but the transparent nature of vapor cells makes 3-dimensional imaging possible. Thick cells can be manufactured by this method by stacking unit cells together or to make unique shapes, such as taking anodically bonded glass+frames (laser cut together), stacking them and anodically bonding several together one at a time, and then capping the structure with a contact bond.

The methods of manufacturing may include a contact-bonding operation to fabricate a vapor cell. The contact-bonding operation may include processes to chemically alter a surface of a dielectric body (or frame) and a mating surface of an optical window. The altered surfaces are then contacted together to form metal-oxygen bonds (e.g., siloxane bonds) that create a seal. In some implementations, a method of manufacturing a vapor cell includes obtaining a dielectric body that has a surface that defines an opening to a cavity in the dielectric body. The method also includes obtaining an optical window that has a surface (or mating surface). One or both of the surfaces of the dielectric body and the optical window may have a surface roughness, $R_a$, no greater than a threshold surface roughness, such as described in relation to the vapor cell 100 of FIGS. 1A-1B. For example, the threshold surface roughness may be 1 nm. In some instances, the surface of the dielectric body and the surface of the optical window are planar surfaces.

In the method, the surfaces of the dielectric body and the optical window are altered to include, respectively, a first plurality of hydroxyl ligands and a second plurality of hydroxyl ligands. The method additionally includes disposing a vapor, or a source of the vapor, into the cavity. The altered surface of the dielectric body is contacted to the altered surface of the optical window to form a seal around the opening to the cavity. The seal, which may define part or all of a contact bond, includes metal-oxygen bonds formed by reacting the first plurality of hydroxyl ligands with the second plurality of hydroxyl ligands during contact of the altered surfaces. In some variations, contacting the altered surfaces includes covering the opening of the cavity with the optical window to enclose the vapor or the source of the vapor in the cavity.

The dielectric body and optical window may be formed of materials transparent to electric fields (or electromagnetic radiation) measured by the vapor cell. Examples of such materials are described in relation to the dielectric body 102 and optical window 104 of FIGS. 1A-1B. For example, the dielectric body may be formed of silicon or a glass comprising silicon oxide (e.g., $SiO_2$, $SiO_x$, etc.). The optical window may include silicon oxide (e.g., $SiO_2$, $SiO_x$, etc.). In these examples, the metal-oxygen bonds may include siloxane bonds. In implementations where the dielectric body is formed of a non-oxide material, the method may include forming an adhesion layer on the dielectric body that defines the surface of the dielectric body. For example, if the dielectric body is formed of silicon, the adhesion layer may include silicon oxide (e.g., $SiO_2$, $SiO_x$, etc.), such as described in relation to the vapor cell 300 of FIG. 3.

As described above, the vapor or the source of the vapor is disposed into the cavity while conducting the method. The vapor may include a gas of alkali-metal atoms, a gas of diatomic halogen molecules, a gas of organic molecules, a noble gas, or some combination thereof, such as described in relation to the vapor cell 100 of FIGS. 1A-1B. In some implementations, disposing the vapor or the source of the vapor includes exposing the cavity to a vacuum environment comprising a gas of alkali-metal atoms. In some implementations, disposing the vapor or the source of the vapor includes disposing a solid or liquid source of alkali-metal atoms into the cavity. In these implementations, the method includes heating the solid or liquid source of alkali-metal atoms to generate a gas of the alkali-metal atoms after contacting. However, other types of energetic stimulus are possible for the solid or liquid source of alkali-metal atoms (e.g., exposure to laser light, ultraviolet radiation, etc.).

In some implementations, altering the surfaces includes activating one or both of the surfaces of the dielectric body and the optical window by exposing the respective surfaces to a plasma. Such exposure may increase a surface energy of one or both the surfaces of the dielectric body and the optical window and chemically prepare the surfaces for subsequent contact bonding. Further chemical preparation may occur by washing one or both of the activated surfaces of the dielectric body and the optical window in a basic aqueous solution. Contact with the basic aqueous solution may coordinate metal atoms on the surfaces of the dielectric body and the optical window with hydroxyl ligands.

In some implementations, contacting the altered surfaces includes pressing the altered surfaces of the dielectric body and the optical window against each other. In some instances, the seal is formed upon contact of the altered surfaces. In other instances, pressing may involve contacting the altered surfaces with a pressure up to 2 MPa. In some implementations, the method includes heating one or both the dielectric body and the optical window after contacting the altered surfaces. For example, one or both of the dielectric body and the optical window may be heated to a temperature ranging from 100° C.-250° C. after contacting the altered surfaces. While heating, the dielectric body and the optical window may be clamped together to hold the altered surfaces in contact.

In some implementations, obtaining the dielectric body includes removing material from the dielectric body to form the cavity. Removing material may include machining material from the surface of the dielectric body with a laser. Removing material may also include etching material from the surface of the dielectric body. Such etching may involve one or both of a dry or wet etching process. Other types of subtractive processes are possible for the operation of removing material (e.g., ablation, grinding, polishing, etc.).

The methods of manufacturing described herein may be used to fabricate vapor cells with more than one optical window. In some implementations, a method of manufacturing a vapor cell that has at least two optical windows includes obtaining a dielectric body. The dielectric body has a cavity therein and includes a first surface that defines a first opening to the cavity and a second surface that defines a second opening to the cavity. The method also includes obtaining a first optical window that has a surface. The surface of the first optical window is bonded to the first surface of the dielectric body to form a first seal around the first opening to the cavity. In some implementations, bonding the surfaces includes covering the first opening of the cavity with the first optical window.

The method additionally includes obtaining a second optical window that includes a surface. The second surface of the dielectric body and the surface of the second optical window are altered to include, respectively, a first plurality of hydroxyl ligands and a second plurality of hydroxyl ligands. The method further includes disposing a vapor or a source of the vapor into the cavity through the second opening. The altered second surface of the dielectric body is contacted to the altered surface of the second optical window to form a second seal around the second opening to the cavity. The second seal includes metal-oxygen bonds formed by reacting the first plurality of hydroxyl ligands with the second plurality of hydroxyl ligands during contact of the altered surfaces. In some implementations, contacting the altered surfaces includes covering the second opening of the cavity with the second optical window to enclose the vapor or the source of the vapor in the cavity.

One or both of the second surface of the dielectric body and the surface of the second optical window may have a surface roughness, $R_a$, no greater than a threshold surface roughness, such as described in relation to the vapor cell 200 of FIGS. 2A-2B. For example, the threshold surface roughness may be 1 nm. In some implementations, the threshold surface roughness is a second threshold surface roughness and one or both of the first surface of the dielectric body and the surface of the first optical window may have a surface roughness, $R_a$, no greater than a first threshold surface roughness. The first threshold surface roughness need not be the same as the second threshold surface roughness. In some variations, the first and second surfaces of the dielectric body are planar surfaces opposite each other, and the surface of the first optical window and the surface of the second optical window are planar surfaces.

In the method, the surfaces of the dielectric body and the optical window are altered to include, respectively, a first plurality of hydroxyl ligands and a second plurality of hydroxyl ligands. The method additionally includes disposing a vapor, or a source of the vapor, into the cavity. The altered surface of the dielectric body is contacted to the altered surface of the optical window to form a seal around the opening to the cavity. The seal, which may define part or all of a contact bond, includes metal-oxygen bonds formed by reacting the first plurality of hydroxyl ligands with the second plurality of hydroxyl ligands during contact of the altered surfaces. In some variations, contacting the altered surfaces includes covering the opening of the cavity with the optical window to enclose the vapor or the source of the vapor in the cavity.

The dielectric body, the first optical window, and the second optical window may be formed of materials highly transparent to electric fields (or electromagnetic radiation) measured by the vapor cell. Examples of such materials are described in relation to the dielectric bodies 102, 202 and optical windows 104, 214, 218 of FIGS. 1A-2B. For example, the dielectric body may be formed of silicon or a glass comprising silicon oxide (e.g., $SiO_2$, $SiO_x$, etc.), and one or both of the first and second optical windows may include silicon oxide (e.g., $SiO_2$, $SiO_x$, etc.). In these examples, the metal-oxygen bonds may include siloxane bonds. In implementations where the dielectric body is formed of a non-oxide material, the method may include forming an adhesion layer on the dielectric body that defines the second surface of the dielectric body. For example, if the dielectric body is formed of silicon, the adhesion layer may include silicon oxide (e.g., $SiO_2$, $SiO_x$, etc.), such as described in relation to the vapor cell 300 of FIG. 3.

As described above, the vapor or the source of the vapor is disposed into the cavity while conducting the method. The vapor may include a gas of alkali-metal atoms, a gas of diatomic halogen molecules, a gas of organic molecules, a noble gas, or some combination thereof, such as described in relation to the vapor cells 100, 200 of FIGS. 1A-2B. In some implementations, disposing the vapor or the source of the vapor includes exposing the cavity to a vacuum environment comprising a gas of alkali-metal atoms. In some implementations, disposing the vapor or the source of the vapor includes disposing a solid or liquid source of alkali-metal atoms into the cavity through the second opening. In these implementations, the method includes heating the solid or liquid source of alkali-metal atoms to generate a gas of the alkali-metal atoms after contacting. However, other types of energetic stimulus are possible for the solid or liquid source of alkali-metal atoms (e.g., exposure to laser light, ultraviolet radiation, etc.).

In some implementations, altering the surfaces includes activating one or both of the second surface of the dielectric body and the surface of the second optical window by exposing the respective surfaces to a plasma. Such exposure may increase a surface energy of one or both the second surfaces of the dielectric body and the surface of the second optical window and chemically prepare the surfaces for subsequent contact bonding. Further chemical preparation may occur by washing one or both of the activated surfaces of the dielectric body and the second optical window in a basic aqueous solution. Contact with the basic aqueous solution may coordinate metal atoms on the surfaces of the dielectric body and the optical window with hydroxyl ligands.

In some implementations, contacting the altered surfaces includes pressing the altered second surface of the dielectric body and the altered surface of the second optical window against each other. In some instances, the second seal is formed upon contact of the altered surfaces. In other instances, pressing may involve contacting the altered surfaces with a pressure up to 2 MPa. In some implementations, the method includes heating one or both the dielectric body and the second optical window after contacting the altered surfaces. For example, one or both of the dielectric body and the second optical window may be heated to a temperature ranging from 100° C.-250° C. after contacting the altered surfaces. While heating, the dielectric body and the second optical window may be clamped together to hold the altered surfaces in contact.

In the method, the first optical window may be contact bonded to the dielectric body in addition to the second optical window. In some implementations, bonding the surface of the first optical window includes altering the first surface of the dielectric body and the surface of the first optical window to include, respectively, a third plurality of hydroxyl ligands and a fourth plurality of hydroxyl ligands. The altered first surface of the dielectric body is contacted to the altered surface of the first optical window to form the first seal around the first opening to the cavity. The first seal includes metal-oxygen bonds formed by reacting the third plurality of hydroxyl ligands with the fourth plurality of hydroxyl ligands during contact of the altered surfaces. In these implementations, contacting the altered first surface of the dielectric body to the altered surface of the first optical window may include pressing the altered surfaces against each other. In some instances, the first seal is formed upon contact of the altered surfaces. In other instances, pressing may involve contacting the altered surfaces with a pressure up to 2 MPa. In some variations, one or both the dielectric body and the first optical window are heated after the altered surfaces are contacted. For example, one or both of the dielectric body and the first optical window may be heated to a temperature ranging from 100° C.-250° C. after contacting the altered surfaces. While heating, the dielectric body and the first optical window may be clamped together to hold the altered surfaces in contact.

The method also allows the first optical window to be contact bonded to the dielectric body with a bond other than a contact bond. For example, the dielectric body may be formed of silicon and the first optical window may include silicon oxide (e.g., $SiO_2$, $SiO_x$, etc.). In this example, bonding the surface of the first optical window includes anodically bonding the surface of the first optical window to the first surface of the dielectric body to form the first seal. The example vapor cell 300 of FIG. 3 may correspond to a vapor cell manufactured by this variation of the method. In another example, the dielectric body may be formed of a glass comprising silicon oxide and the first optical window may include silicon oxide (e.g., $SiO_2$, $SiO_x$, etc.). In this second example, the method includes depositing a layer of silicon on the first surface of the dielectric body, and bonding the surface of the first optical window includes anodically bonding the layer of silicon to the surface of the first optical window to form the first seal. The example vapor cell 400 of FIG. 4 may correspond to a vapor cell manufactured by this variation of the method. In yet another example, the dielectric body may be formed of a glass comprising silicon oxide and the first optical window may include silicon oxide (e.g., $SiO_2$, $SiO_x$, etc.). In this third example, bonding the surface of the first optical window includes applying a glass frit to one or both of the first surface of the dielectric body and the surface of the first optical window. The first surface of the dielectric body is contacted to the surface of the first optical window, and at least one of the glass frit, the dielectric body, or the first optical window are heated to a firing temperature to form the first seal. Although the forgoing examples have been presented in the context of silicon and silicon oxide, other materials are possible for the method.

In some implementations, obtaining the dielectric body includes removing material from the dielectric body to form the cavity. Removing material may include machining material from the surface of the dielectric body with a laser. Removing material may also include etching material from the surface of the dielectric body. Such etching may involve one or both of a dry or wet etching process. Other types of subtractive processes are possible for the operation of removing material (e.g., ablation, grinding, polishing, etc.).

EXAMPLES

The methods of manufacturing vapor cells may be described by the following examples. However, examples are for purposes of illustration only. It will be apparent to those skilled in the art that many modifications, both to materials and methods, may be practiced without departing from the scope of the disclosure.

Example 1

A p-type silicon wafer was obtained with a double-sided polish and an <100> orientation. The silicon wafer had a diameter of 4-inches and was 500 µm thick with a surface roughness, $R_a$, no greater than 1 nm on each side. Electrical properties of the silicon wafer included a resistance that ranged from 0.1 Ω-cm to 0.3 Ω-cm. A glass wafer formed of borosilicate glass was also obtained from Schott. The glass wafer was a MEMpax wafer having a diameter of 4 inches and a thickness of 300 µm. The surface roughness was less than 0.5 nm.

The silicon and glass wafers were inspected in preparation for anodic and contact bonding. In particular, the wafers were visually inspected for chips, micro-cracks, and scratches. The wafers were also verified to have a surface roughness less than 1 nm. A 500-nm layer of $SiO_2$ was grown on both sides of the silicon wafer using a wet growth process in an oxidation furnace. The temperature of the oxidation furnace was set to about 1100° C. and the processing time of the silicon wafer was about 40 min. A thickness uniformity of the silicon wafer (with the $SiO_2$ layers) was verified to be within 500±6 nm over its 4-inch diameter area. The surface roughness was also verified to be less than 1 nm.

Multiple silicon chips were cut from the silicon wafer using either a Protolaser U3 micro-laser tool, a Protolaser R micro-laser tool, or a DISCO DAD 3240 dicing saw. Each silicon chip had dimensions of 10 mm×20 mm. Nine holes were subsequently machined through each of the silicon chips using the Protolaser U3 micro-laser tool or the Protolaser R micro-laser tool. The holes were each circular with a 1-mm diameter or square with a 1-mm edge length. In some cases, combinations of circles and holes were machined in a silicon chip. The silicon chips were inspected visually with 5× and 10× magnification loupes for cracks or chips that might have occurred during cutting. Silicon chips with zero or minimal surface defects were selected for subsequent vapor-cell fabrication.

The selected silicon chips were then cleaned with methanol and isopropanol using cotton swabs and optical tissue paper. Next, the silicon chips were submerged in a buffered oxide etch (BOE) solution having a 10:1 volume ratio and an etch rate of 55 nm/min at room temperature. The buffered oxide etch solution contained hydrofluoric acid buffered with ammonium fluoride. The silicon chips were submerged for at least 11 minutes to remove the 500-nm layer of $SiO_2$ from the surface of each side of the silicon chips. After being removed from the buffered oxide etch, the silicon chips were visually inspected. If embedded material from the cutting process was found on a silicon chip, the silicon chip was discarded. If regions of $SiO_2$ remained on a silicon chip, the silicon chip was re-submerged in the buffered oxide etch solution, removed, and then re-inspected. Silicon chips with both sides free of the 500-nm layer of $SiO_2$ were selected for final cleaning and the growth of a 100-nm $SiO_2$ layer.

The selected silicon chips were then cleaned with acetone and isopropanol using cotton swabs and optical tissue paper. An ultrasonic cleaner was optionally used to assist the cleaning process by agitating baths of acetone or isopropanol in which the selected silicon chips were submerged. A 100-nm layer of $SiO_2$ was then grown on one side of the silicon chips. The temperature of the oxidation furnace was set to a minimum of 600° C. to obtain a surface roughness no greater than 1 nm for the 100-nm layer of $SiO_2$. A thickness uniformity of the 100-nm $SiO_2$ layer was verified to be within 100±6 nm over an area of a silicon chip. Silicon chips failing the uniformity criterion were discarded.

Silicon chips with the 100-nm $SiO_2$ layer were then cleaned with methanol and isopropanol using cotton swabs and optical tissue paper to eliminate loose residues on their surfaces (e.g., such as due to handling). The silicon chips were subsequently deep-cleaned with acetone and isopropanol using cotton swabs and optical tissue paper. A low magnification loupe (e.g., 10×) was used during the deep cleaning process for a first visual inspection followed by a high magnification microscope (e.g., 50×-200×) for a second visual inspection. Silicon chips passing the second vision inspection were placed in a bath of acetone for ultrasonic cleaning at 40 kHz (e.g., in a Branson Ultrasonic Cleaner CPX-952-117R). For example, the silicon chips could be placed in a glass beaker of acetone and cleaned ultrasonically for 20 minutes at room temperature. After ultrasonic cleaning, the silicon chips were dried with particulate-free compressed air and stored in an air-tight container until needed for bonding.

Separately, a dicing saw was used to cut the glass wafers into suitable sizes for bonding to the (stored) silicon chips. Two glass chips were prepared for each silicon chip. If a glass chip was intended for an anodic bond, the glass chip was cut to have the same dimensions as the silicon chip. However, if a glass chip was intended for a contact bond, the glass chip was cut to have longer dimensions than the silicon chip. For example, glass chips for anodic bonding had dimensions of 10 mm×20 mm and glass chips for contact bonding had dimensions of 10 mm×35 mm. After cutting, each glass chip was inspected to ensure that its optical clarity was not degraded (e.g., hazing), or that scratches or cracks were not present. Glass chips found to be acceptable were then cleaned with acetone using cotton swabs and optical tissue paper. If necessary, the glass chips were placed in a glass beaker of acetone and ultrasonically cleaned form 20 minutes at room temperature. After ultrasonic cleaning, the glass chips were dried with particulate-free compressed air and then stored in an air-tight container until needed for bonding.

One silicon chip and one glass chip were then placed into an assembly for anodic bonding. For the silicon chip, the planar surface opposite the planar surface defined by the 100-nm layer of $SiO_2$ participated in the anodic bonding process. In the assembly, planar surfaces of silicon and glass chips were contacted to define an interface, and the interface was visually inspected to confirm that optical fringes were present. The silicon chip was then heated to a temperature of about 400° C. After this temperature was reached, 600V was applied across the silicon and glass chips for about 15 minutes, which drove the formation of an anodic bond. The interface was inspected again to confirm the disappearance of the optical fringes, which indicated the anodic bond was complete. Next, the anodic bond was inspected for defects (e.g., bubbles, micro-cracks, unbonded areas, etc.). If 80% or more of an area around the holes was free of defects, the anodic bond was then further inspected for open channels (e.g., from a hole to the environment, a hole to another hole, etc.). If an open channel was discovered, the anodically-bonded chips were discarded as the anodic bond was not deemed leak-tight.

Bonded silicon and glass chips with leak-tight anodic bonds were cleaned in acetone and methanol. During this cleaning process, the unbonded surface of the silicon chip was cleaned with acetone and methanol using cotton swabs and optical tissue paper to eliminate any residues (e.g., residues from a graphite plate of the assembly used to form the anodic bond). The unbonded surface of the silicon chip was then visually inspected to ensure defects (e.g., scratches, pitting, etc.) were not present that might compromise a soon-to-be formed contact bond. The anodically-bonded chips were then individually cleaned. In particular, the anodically-bonded chips were placed individually (i.e., with no other chips) in a glass beaker of acetone and cleaned ultrasonically for 20 minutes at room temperature. After ultrasonic cleaning, the anodically-bonded chips were dried with particulate-free compressed air. A low magnification loupe (e.g., 10×) was used for a first visual inspection of the anodically-bonded chips, followed by a high magnification microscope (e.g., 50×-200×) for a second visual inspection. The first and second visual inspections were used to ensure no visual residues or deposits remained on the anodically-bonded chips.

The anodically-bonded chips—along with glass chips—were then taken into a clean room environment (e.g., Class 1000 or better) for contact bonding. Single instances of the anodically-bonded chips were paired with single instances of the glass chips to define a pair of chips for contact bonding. For each pair, a planar surface defined by the 100-nm layer of $SiO_2$ on the silicon chip and a planar surface of the glass chip were wiped with optical paper and acetone to clean any macroscopic deposits or contaminants from them. Each pair was then submerged in an acetone bath (e.g., acetone in a beaker) and cleaned via ultrasonic cleaning for 15 minutes. Each pair of chips was subsequently removed from the acetone bath, rinsed with isopropanol (e.g., submerged in an isopropanol bath), and blown dry with dry nitrogen gas.

A pair of chips was placed in a YES-CV200RFS plasma cleaner and cleaned for 45 seconds using a nitrogen plasma. (In some instances, multiple pairs of chips were place in the plasma cleaner.) In particular, the planar surface defined by the 100-nm layer of $SiO_2$ on the silicon chip and the planar surface of the glass chip were activated by plasma cleaning. The RF-power of the plasma cleaner was set at about 75 W, and the pressure inside was maintained at about 150 mTorr. Nitrogen gas introduced into the plasma cleaner at a volume flow rate of about 20 sccm. After activation by plasma cleaning, the pair of chips was removed from the YES-CV200RFS plasma cleaner and rinsed in de-ionized water for 5 minutes. The rinsing process served to hydroxylate the activated surfaces. In some variations, the rinsing process was conducted with a basic aqueous solution (e.g., an aqueous solution of ammonium hydroxide). Care was taken not to touch the two hydroxylated and activated surfaces together.

The pair of chips was then transferred into a vacuum chamber and mounted into a fixture having a "press finger". The fixture held the glass chip adjacent the silicon chip of the anodically-bonded chip to define a gap. The activated and hydroxylated surface of the glass chip faced the activated and hydroxylated $SiO_2$ surface of the silicon chip. The vacuum chamber was then sealed and pumped down to a reduced pressure (e.g., less than $10^{-3}$ Torr) to remove volatile species (e.g., water vapor) that might react with a vapor of cesium atoms used to fill the cavities of the anodically-bonded chip. The fixture was then chilled to by a thermoelectric cooler, which in turn, chilled at least the anodically-bonded chip to a temperature between $-20°$ C. and $0°$ C.

After the temperatures of the pair of chips stabilized, the vapor of cesium atoms was introduced into the vacuum chamber by opening a valve connecting a source of cesium vapor to the vacuum chamber. The source of the cesium vapor was an oven containing a mass of cesium heated to a processing temperature. A target pressure of cesium vapor in the vacuum chamber could be controlled by altering an opening of the valve, altering the processing temperature induced by the oven, or both. Once the pressure in the vacuum chamber stabilized to the target pressure of cesium vapor, the pair of chips was exposed to the vapor of cesium atoms for a length of time.

The pressure of cesium vapor in the vacuum chamber influences the length of time needed to fill the anodically-bonded chip. One or both of the pressure of cesium vapor in the vacuum chamber and the period of time can be varied to control an amount of cesium vapor that condenses in the cavities of the anodically-bonded chip. Once the length of time had elapsed, the value to the source of cesium vapor was closed. The vacuum chamber was subsequently pumped down to the reduced pressure (e.g., less than $10^{-3}$ Torr) and the power to the thermoelectric cooler turned off.

Once the pair of chips reached ambient temperature, the fixture was actuated to contact the activated and hydroxylated surface of the glass chip to the activated and hydroxylated $SiO_2$ surface of the silicon chip. The "press finger" was used to hold the contacted surfaces together for 20 minutes, which drove the formation of a contact bond. In some variations, the "press finger" was used to apply a target pressure (e.g., about 2 MPa) during the 20-minute duration.

Example 2

A thick glass wafer was obtained from Howard Glass Co., Inc. with a thickness of 1 mm and a diameter of 4 inches. The thick glass wafer had a surface roughness, $R_a$, no greater than 1 nm on each side. Electrical properties of the silicon wafer included a resistance that ranged from 0.1 $\Omega$-cm to 0.3 $\Omega$-cm. A thin glass wafer formed of borosilicate glass was also obtained from Schott. The thin glass wafer was a MEMpax wafer having a diameter of 4 inches and a thickness of 300 µm. The surface roughness was less than 0.5 nm. The thick and thin glass wafers were inspected in preparation for anodic and contact bonding. In particular, the glass wafers were visually inspected for chips, micro-cracks, and scratches. The wafers were also verified to have a surface roughness less than 1 nm.

Next, multiple thick glass chips were cut from the thick glass wafer using either a Protolaser R micro-laser tool or a DISCO DAD 3240 dicing saw. Each thick glass chip had dimensions of 10 mm×20 mm. Nine holes were subsequently machined through each of the thick glass chips with a Protolaser R micro-laser tool. The holes were each circular with a 1-mm diameter or square with a 1-mm edge length. In some cases, combinations of circles and holes were machined in a thick glass chip. The thick glass chips were inspected visually with 5× and 10× magnification loupes for cracks or chips that might have occurred during cutting. Thick glass chips with zero or minimal surface defects were selected for subsequent vapor-cell fabrication.

The selected thick glass chips were then cleaned with acetone and isopropanol using cotton swabs and optical tissue paper. An ultrasonic cleaner was optionally used to assist the cleaning process by agitating baths of acetone or isopropanol in which the selected thick glass chips were submerged. A less than 1 µm layer of Si was then grown on one side of the thick glass chips using plasma-enhanced chemical vapor deposition (PECVD). A thickness uniformity of the Si layer was verified to be within ±3 nm over an area of a thick glass chip. Thick glass chips failing the uniformity criterion were discarded.

The thick glass chips were then cleaned with methanol and isopropanol using cotton swabs and optical tissue paper to eliminate loose residues on their surfaces (e.g., such as due to handling). The thick glass chips were subsequently deep-cleaned with acetone and isopropanol using cotton swabs and optical tissue paper. A low magnification loupe (e.g., 10×) was used during the deep cleaning process for a first visual inspection followed by a high magnification microscope (e.g., 50×-200×) for a second visual inspection. Thick glass chips passing the second vision inspection were placed in a bath of acetone for ultrasonic cleaning at 40 kHz (e.g., in a Branson Ultrasonic Cleaner CPX-952-117R). For example, the thick glass chips could be placed in a glass beaker of acetone and ultrasonically cleaned for 20 minutes at room temperature. After ultrasonic cleaning, the thick glass chips were dried with particulate-free compressed air and stored in an air-tight container until needed for bonding.

Separately, a dicing saw was used to cut the thin glass wafers into suitable sizes for bonding to the (stored) thick glass chips. Two thin glass chips were prepared for each thick glass chip. If a thin glass chip was intended for an anodic bond, the thin glass chip was cut to have the same dimensions as the thick glass chip. However, if a thin glass chip was intended for a contact bond, the thin glass chip was cut to have longer dimensions than the thick glass chip. For example, thin glass chips for anodic bonding had dimensions of 10 mm×20 mm and thin glass chips for contact bonding had dimensions of 10 mm×35 mm. After cutting, each thin glass chip was inspected to ensure that its optical clarity was not degraded (e.g., hazing), or that scratches or cracks were not present. Then glass chips found to be acceptable were then cleaned with acetone using cotton swabs and optical tissue paper. If necessary, the thin glass chips were placed in a glass beaker of acetone and ultrasonically cleaned form 20 minutes at room temperature. After ultrasonic cleaning, the glass chips were dried with particulate-free compressed air and then stored in an airtight container until needed for bonding.

One thick glass chip (with a layer of Si up to 1 µm thick) and one thin glass chip were then placed into an assembly for anodic bonding. For the thick glass chip, the planar surface defined by the up to 1 µm layer of Si participated in the anodic bonding process. In the assembly, planar surfaces of the thick and thin glass chips were contacted to define an interface, and the interface was visually inspected to confirm that optical fringes were present. The thick glass chip was then heated to a temperature of about 400° C. After this temperature was reached, 600V was applied across the thick and thin glass chips for about 15 minutes, which drove the formation of an anodic bond. The interface was inspected again to confirm the disappearance of the optical fringes, which indicated the anodic bond was complete. Next, the anodic bond was inspected for defects (e.g., bubbles, microcracks, unbonded areas, etc.). If 80% or more of an area around the holes was free of defects, the anodic bond was then further inspected for open channels (e.g., from a hole to the environment, a hole to another hole, etc.). If an open channel was discovered, the anodically-bonded chips were discarded as the anodic bond was not deemed leak-tight.

Bonded thick and thin glass chips with leak-tight anodic bonds were cleaned in acetone and methanol. During this cleaning process, the unbonded surface of the thick glass chip was cleaned with acetone and methanol using cotton swabs and optical tissue paper to eliminate any residues (e.g., residues from a graphite plate of the assembly used to form the anodic bond). The unbonded surface of the thick glass chip was then visually inspected to ensure defects (e.g., scratches, pitting, etc.) were not present that might compromise a soon-to-be formed contact bond. The anodically-bonded chips were then individually cleaned. In particular, the anodically-bonded chips were placed individually (i.e., with no other chips) in a glass beaker of acetone and cleaned ultrasonically for 20 minutes at room temperature. After ultrasonic cleaning, the anodically-bonded chips were dried with particulate-free compressed air. A low magnification loupe (e.g., 10×) was used for a first visual inspection of the anodically-bonded chips, followed by a high magnification microscope (e.g., 50×-200×) for a second visual inspection. The first and second visual inspections were used to ensure no visual residues or deposits remained on the anodically-bonded chips.

The anodically-bonded chips—along with unbonded thin glass chips—were then taken into a clean room environment (e.g., Class 1000 or better) for contact bonding. Single instances of anodically-bonded chips were paired with single instances of thin glass chips to define a pair for contact bonding. For each pair, an unbonded planar surface of the thick glass chip (i.e., without the layer of Si up to 1 µm) and a planar surface of the thin glass chip were wiped with optical paper and acetone to clean any macroscopic deposits or contaminants from them. Each pair was then submerged in an acetone bath (e.g., acetone in a beaker) and cleaned via ultrasonic cleaning for 15 minutes. Each pair of chips was subsequently removed from the acetone bath, rinsed with isopropanol (e.g., submerged in an isopropanol bath), and blown dry with dry nitrogen gas.

A pair of chips was placed in a YES-CV200RFS plasma cleaner and cleaned for 45 seconds using a nitrogen plasma. (In some instances, multiple pairs of chips were place in the plasma cleaner.) In particular, the unbonded planar surface of the thick glass chip and the planar surface of the glass chip were activated by plasma cleaning. The RF-power of the plasma cleaner was set at about 75 W, and the pressure inside was maintained at about 150 mTorr. Nitrogen gas introduced into the plasma cleaner at a volume flow rate of about 20 sccm. After activation by plasma cleaning, the pair of chips was removed from the YES-CV200RFS plasma cleaner and rinsed in de-ionized water for 5 minutes. The rinsing process served to hydroxylate the activated surfaces. In some variations, the rinsing process was conducted with a basic aqueous solution (e.g., an aqueous solution of ammonium hydroxide). Care was taken not to touch the two hydroxylated and activated surfaces together.

The pair of chips was then transferred into a vacuum chamber and mounted into a fixture having a "press finger". The fixture held the thin glass chip adjacent the thick glass chip of the anodically-bonded chip to define a gap. The activated and hydroxylated surface of the thin glass chip faced the activated and hydroxylated unbonded surface of the thick glass chip. The vacuum chamber was then sealed and pumped down to a reduced pressure (e.g., less than $10^{-3}$ Torr) to remove volatile species (e.g., water vapor) that might react with a vapor of cesium atoms used to fill the cavities of the anodically-bonded chip. The fixture was then chilled to by a thermoelectric cooler, which in turn, chilled at least the anodically-bonded chip to a temperature between $-20°$ C. and $0°$ C.

After the temperatures of the pair of chips stabilized, the vapor of cesium atoms was introduced into the vacuum chamber by opening a valve connecting a source of cesium vapor to the vacuum chamber. The source of the cesium vapor was an oven containing a mass of cesium heated to a processing temperature. A target pressure of cesium vapor in the vacuum chamber could be controlled by altering an opening of the valve, altering the processing temperature induced by the oven, or both. Once the pressure in the vacuum chamber stabilized to the target pressure of cesium vapor, the pair of chips was exposed to the vapor of cesium atoms for a length of time.

The pressure of cesium vapor in the vacuum chamber influences the length of time needed to fill the anodically-bonded chip. One or both of the pressure of cesium vapor in the vacuum chamber and the length of time can be varied to control an amount of cesium vapor that condenses in the cavities of the anodically-bonded chip. Once the length of time had elapsed, the value to the source of cesium vapor was closed. The vacuum chamber was subsequently pumped down to the reduced pressure (e.g., less than $10^{-3}$ Torr) and the power to the thermoelectric cooler turned off.

Once the pair of chips reached ambient temperature, the fixture was actuated to contact the activated and hydroxylated surface of the glass chip to the activated and hydroxylated unbonded surface of the thick glass chip. The "press finger" was used to hold the contacted surfaces together for 20 minutes, which drove the formation of a contact bond. In some variations, the "press finger" was used to apply a target pressure (e.g., about 2 MPa) during the 20-minute duration.

In some aspects of what is described, a method of manufacturing a vapor cell may be also be described by the following examples:

Example 1

A method of manufacturing a vapor cell, the method comprising:
  obtaining a dielectric body comprising a surface that defines an opening to a cavity in the dielectric body;
  obtaining an optical window that comprises a surface;
  altering the surface of the dielectric body and the surface of the optical window to comprise, respectively, a first plurality of hydroxyl ligands and a second plurality of hydroxyl ligands;
  disposing a vapor or a source of the vapor into the cavity; and
  contacting the altered surface of the dielectric body to the altered surface of the optical window to form a seal around the opening to the cavity, the seal comprising metal-oxygen bonds formed by reacting the first plurality of hydroxyl ligands with the second plurality of hydroxyl ligands during contact of the altered surfaces.

Example 2

The method of example 1, wherein contacting the altered surfaces comprises covering the opening of the cavity with the optical window to enclose the vapor or the source of the vapor in the cavity.

Example 3

The method of example 1 or example 2, wherein the dielectric body is formed of silicon.

Example 4

The method of example 3, comprising:
  forming an adhesion layer on the dielectric body that defines the surface of the dielectric body, the adhesion layer comprising silicon oxide.

Example 5

The method of example 1 or example 2, wherein the dielectric body is formed of a glass comprising silicon oxide.

Example 6

The method of example 1 or any one of examples 2-5, wherein the metal-oxygen bonds comprise siloxane bonds.

Example 7

The method of example 1 or any one of examples 2-6, wherein the optical window comprises silicon oxide.

Example 8

The method of example 1 or any one of examples 2-7, wherein the vapor comprises a gas of alkali-metal atoms.

Example 9

The method of example 1 or any one of examples 2-7, wherein the vapor comprises a gas of diatomic halogen molecules.

Example 10

The method of example 1 or any one of examples 2-7, wherein the vapor comprises a gas of organic molecules.

Example 11

The method of example 1 or any one of examples 2-8, wherein disposing the vapor or the source of the vapor comprises exposing the cavity to a vacuum environment comprising a gas of alkali-metal atoms.

Example 12

The method of example 1 or any one of examples 2-8,
  wherein disposing the vapor or the source of the vapor comprises disposing a solid or liquid source of alkali-metal atoms into the cavity; and
  wherein the method comprises:
    after contacting, heating the solid or liquid source of alkali-metal atoms to generate a gas of the alkali-metal atoms.

Example 13

The method of example 1 or any one of examples 2-12, wherein the vapor comprises a noble gas.

Example 14

The method of example 1 or any one of examples 2-13, wherein altering the surfaces comprises activating one or both of the surfaces of the dielectric body and the optical window by exposing the respective surfaces to a plasma.

Example 15

The method of example 14, wherein altering the surfaces further comprises washing one or both of the activated surfaces of the dielectric body and the optical window in a basic aqueous solution.

Example 16

The method of example 1 or any one of examples 2-15, wherein the surface of the dielectric body and the surface of the optical window are planar surfaces.

Example 17

The method of example 1 or any one of examples 2-16, wherein the surface of the dielectric body and the surface of the optical window have a surface roughness, $R_a$, no greater than 1 nm.

Example 18

The method of example 1 or any one of examples 2-17, wherein contacting the altered surfaces comprises pressing the altered surfaces of the dielectric body and the optical window against each other.

Example 19

The method of example 1 or any one of examples 2-18, comprising:
heating one or both the dielectric body and the optical window after contacting the altered surfaces; and
while heating, clamping the dielectric body and the optical window together to hold the altered surfaces in contact.

Example 20

The method of example 1 or any one of examples 2-19, wherein obtaining the dielectric body comprises removing material from the dielectric body to form the cavity.

Example 21

The method of example 20, wherein removing material comprises machining material from the surface of the dielectric body with a laser.

Example 22

The method of example 20 or example 21, wherein removing material comprises etching material from the surface of the dielectric body.

In some aspects of what is described, a vapor cell may be also be described by the following examples:

Example 23

A vapor cell, comprising:
a dielectric body comprising a surface that defines an opening to a cavity in the dielectric body;
a vapor or a source of the vapor in the cavity of the dielectric body; and
an optical window covering the opening of the cavity and having a surface bonded to the surface of the dielectric body to form a seal around the opening, the seal comprising metal-oxygen bonds formed by reacting a first plurality of hydroxyl ligands on the surface of the dielectric body with a second plurality of hydroxyl ligands on the surface of the optical window.

Example 24

The vapor cell of example 23, wherein the dielectric body is formed of silicon.

Example 25

The vapor cell of example 24, wherein the vapor cell comprises an adhesion layer on the dielectric body that defines the surface of the dielectric body, the adhesion layer comprising silicon oxide.

Example 26

The vapor cell of example 23, wherein the dielectric body is formed of a glass comprising silicon oxide.

Example 27

The vapor cell of example 23 or any one of examples 24-26, wherein the metal-oxygen bonds comprise siloxane bonds.

Example 28

The vapor cell of example 23 or any one of examples 24-27, wherein the optical window comprises silicon oxide.

Example 29

The vapor cell of example 23 or any one of examples 24-28, wherein the vapor comprises a gas of alkali-metal atoms.

Example 30

The vapor cell of example 23 or any one of examples 24-28, wherein the vapor comprises a gas of diatomic halogen molecules.

Example 31

The vapor cell of example 23 or any one of examples 24-28, wherein the vapor comprises a gas of organic molecules.

Example 32

The vapor cell of example 23 or any one of examples 24-29,
wherein the source of the vapor resides in the cavity of the dielectric body; and
wherein the source of the vapor comprises a liquid or solid source of alkali-metal atoms configured to generate a gas of the alkali-metal atoms when heated.

Example 33

The vapor cell of example 23 or any one of examples 24-32, wherein the vapor comprises a noble gas.

Example 34

The vapor cell of example 23 or any one of examples 24-33, wherein the surface of the dielectric body and the surface of the optical window have a surface roughness, $R_a$, no greater than 1 nm.

In some aspects of what is described, a method of manufacturing a vapor cell that has at least two optical windows may be also be described by the following examples:

Example 35

A method of manufacturing a vapor cell that has at least two optical windows, the method comprising:
obtaining a dielectric body comprising:
a cavity in the dielectric body,
a first surface that defines a first opening to the cavity, and
a second surface that defines a second opening to the cavity;
obtaining a first optical window that comprises a surface;
bonding the surface of the first optical window to the first surface of the dielectric body to form a first seal around the first opening to the cavity;
obtaining a second optical window that comprises a surface;
altering the second surface of the dielectric body and the surface of the second optical window to comprise, respectively, a first plurality of hydroxyl ligands and a second plurality of hydroxyl ligands;

disposing a vapor or a source of the vapor into the cavity through the second opening;

contacting the altered second surface of the dielectric body to the altered surface of the second optical window to form a second seal around the second opening to the cavity, the second seal comprising metal-oxygen bonds formed by reacting the first plurality of hydroxyl ligands with the second plurality of hydroxyl ligands during contact of the altered surfaces.

Example 36

The method of example 35, wherein bonding the surface of the first optical window to the first surface of the dielectric body includes covering the first opening of the cavity with the first optical window.

Example 37

The method of example 35 or example 36, wherein contacting the altered surfaces comprises covering the second opening of the cavity with the second optical window to enclose the vapor or the source of the vapor in the cavity.

Example 38

The method of example 35 or any one of examples 36-37, wherein the dielectric body is formed of silicon.

Example 39

The method of example 38, comprising:
forming an adhesion layer on the dielectric body that defines the second surface of the dielectric body, the adhesion layer comprising silicon oxide.

Example 40

The method of example 35 or any one of examples 36-37, wherein the dielectric body is formed of a glass comprising silicon oxide.

Example 41

The method of example 35 or any one of examples 36-40, wherein the metal-oxygen bonds of the second seal comprise siloxane bonds.

Example 42

The method of example 35 or any one of examples 36-41, wherein the first and second optical windows comprise silicon oxide.

Example 43

The method of example 35 or any one of examples 36-42, wherein the vapor comprises a gas of alkali-metal atoms.

Example 44

The method of example 35 or any one of examples 36-42, wherein the vapor comprises a gas of diatomic halogen molecules.

Example 45

The method of example 35 or any one of examples 36-42, wherein the vapor comprises a gas of organic molecules.

Example 46

The method of example 35 or any one of examples 36-43, wherein disposing the vapor or the source of the vapor comprises exposing the cavity to a vacuum environment comprising a gas of alkali-metal atoms.

Example 47

The method of example 35 or any one of examples 36-43,
wherein disposing the vapor or the source of the vapor comprises disposing a solid or liquid source of alkali-metal atoms into the cavity through the second opening; and
wherein the method comprises:
after contacting, heating the solid or liquid source of alkali-metal atoms to generate a gas of the alkali-metal atoms.

Example 48

The method of example 35 or any one of examples 36-47, wherein the vapor comprises a noble gas.

Example 49

The method of example 35 or any one of examples 36-48, wherein altering the surfaces comprises activating one or both of the second surface of the dielectric body and the surface of the second optical window by exposing the respective surfaces to a plasma.

Example 50

The method of example 49, wherein altering the surfaces further comprises washing one or both of the activated surfaces of the dielectric body and the second optical window in a basic aqueous solution.

Example 51

The method of example 35 or any one of examples 36-50, wherein the second surface of the dielectric body and the surface of the second optical window have a surface roughness, $R_a$, no greater than 1 nm.

Example 52

The method of example 35 or any one of examples 36-51, wherein contacting the altered surfaces comprises pressing the altered second surface of the dielectric body and the altered surface of the second optical window against each other.

Example 53

The method of example 35 or any one of examples 36-52, comprising:
heating one or both the dielectric body and the second optical window after contacting the altered surfaces; and

29 while heating, clamping the dielectric body and the second optical window together to hold the altered surfaces in contact.

Example 54

The method of example 35 or any one of examples 36-53, wherein bonding the surface of the first optical window comprises:
  altering the first surface of the dielectric body and the surface of the first optical window to comprise, respectively, a third plurality of hydroxyl ligands and a fourth plurality of hydroxyl ligands; and
  contacting the altered first surface of the dielectric body to the altered surface of the first optical window to form the first seal around the first opening to the cavity, the first seal comprising metal-oxygen bonds formed by reacting the third plurality of hydroxyl ligands with the fourth plurality of hydroxyl ligands during contact of the altered surfaces.

Example 55

The method of example 35 or any one of examples 36-39 and 41-53 (excluding the subject matter of example 40 in any combination of examples that includes example 55),
  wherein the dielectric body is formed of silicon and the first optical window comprises silicon oxide; and
  wherein bonding the surface of the first optical window comprises anodically bonding the surface of the first optical window to the first surface of the dielectric body to form the first seal.

Example 56

The method of example 35 or any one of examples 36-37 and 40-53 (excluding the subject matter of examples 38-39 in any combination of examples that includes example 56),
  wherein the dielectric body is formed of a glass comprising silicon oxide and the first optical window comprises silicon oxide;
  wherein the method comprises depositing a layer of silicon on the first surface of the dielectric body; and
  wherein bonding the surface of the first optical window comprises anodically bonding the layer of silicon to the surface of the first optical window to form the first seal.

Example 57

The method of example 35 or any one of examples 36-37 and 40-53 (excluding the subject matter of examples 38-39 in any combination of examples that includes example 57),
  wherein the dielectric body is formed of a glass comprising silicon oxide and the first optical window comprises silicon oxide; and
  wherein bonding the surface of the first optical window comprises:
    applying a glass frit to one or both of the first surface of the dielectric body and the surface of the first optical window,
    contacting the first surface of the dielectric body to the surface of the first optical window, and
    heating at least one of the glass frit, the dielectric body, or the first optical window to a firing temperature to form the first seal.

30

Example 58

The method of example 35 or any one of examples 36-57, wherein the first and second surfaces of the dielectric body are planar surfaces opposite each other; and
  wherein the surface of the first optical window and the surface of second optical window are planar surfaces.

Example 59

The method of example 35 or any one of examples 36-58, wherein obtaining the dielectric body comprises removing material from the dielectric body to form the cavity.

Example 60

The method of example 59, wherein removing material comprises machining material from the surface of the dielectric body with a laser.

Example 61

The method of example 59 or example 60, wherein removing material comprises etching material from the surface of the dielectric body.

In some aspects of what is described, a vapor cell having at least two optical windows may be also be described by the following examples:

Example 62

A vapor cell having at least two optical windows, the vapor cell comprising:
  a dielectric body comprising:
    a cavity in the dielectric body,
    a first surface that defines a first opening to the cavity, and
    a second surface that defines a second opening to the cavity;
  a vapor or a source of the vapor in the cavity of the dielectric body;
  a first optical window covering the first opening of the cavity and having a surface bonded to the first surface of the dielectric body to form a first seal around the first opening; and
  a second optical window covering the second opening of the cavity and having a surface bonded to the second surface of the dielectric body to form a second seal around the second opening, the second seal comprising metal-oxygen bonds formed by reacting a first plurality of hydroxyl ligands on the second surface of the dielectric body with a second plurality of hydroxyl ligands on the surface of the second optical window.

Example 63

The vapor cell of example 62, wherein the dielectric body is formed of silicon.

Example 64

The vapor cell of example 63, wherein the vapor cell comprises an adhesion layer on the dielectric body that defines the second surface of the dielectric body, the adhesion layer comprising silicon oxide.

Example 65

The vapor cell of example 62, wherein the dielectric body is formed of a glass comprising silicon oxide.

Example 66

The vapor cell of example 62 or any one of examples 63-65, wherein the metal-oxygen bonds of the second seal comprise siloxane bonds.

Example 67

The vapor cell of example 62 or any one of examples 63-66, wherein the first and second optical windows comprise silicon oxide.

Example 68

The vapor cell of example 62 or any one of examples 63-67, wherein the vapor comprises a gas of alkali-metal atoms.

Example 69

The vapor cell of example 62 or any one of examples 63-67, wherein the vapor comprises a gas of diatomic halogen molecules.

Example 70

The vapor cell of example 62 or any one of examples 63-67, wherein the vapor comprises a gas of organic molecules.

Example 71

The vapor cell of example 62 or any one of examples 63-68,
 wherein the source of the vapor resides in the cavity of the dielectric body; and
 wherein the source of the vapor comprises a liquid or solid source of alkali-metal atoms configured to generate a gas of the alkali-metal atoms when heated.

Example 72

The vapor cell of example 62 or any one of examples 63-71, wherein the vapor comprises a noble gas.

Example 73

The vapor cell of example 62 or any one of examples 63-72, wherein the second surface of the dielectric body and the surface of the second optical window have a surface roughness, $R_a$, no greater than 1 nm.

Example 74

The vapor cell of example 62 or any one of examples 63-73,
 wherein the first and second surfaces of the dielectric body are planar surfaces opposite each other; and
 wherein the surface of the first optical window and the surface of second optical window are planar surfaces.

Example 75

The vapor cell of example 62 or any one of examples 63-74, wherein the first seal comprises metal-oxygen bonds formed by reacting a third plurality of hydroxyl ligands on the first surface of the dielectric body with a fourth plurality of hydroxyl ligands on the surface of the first optical window.

Example 76

The vapor cell of example 62 or any one of examples 63-74, wherein the dielectric body is formed of silicon and the first optical window comprises silicon oxide.

Example 77

The vapor cell of example 76, wherein the first seal comprises an anodic bond between the first surface of the dielectric body and the surface of the first optical window.

Example 78

The vapor cell of example 62 or any one of examples 63-74,
 wherein the dielectric body is formed of a glass comprising silicon oxide and the first optical window comprises silicon oxide;
 wherein the vapor cell comprises a layer of silicon disposed between the first surface of the dielectric body and the surface of the first optical window; and
 wherein the first seal comprises an anodic bond between the layer of silicon and one or both of the first surface of the dielectric body and the surface of the first optical window.

Example 79

The vapor cell of example 62 or any one of examples 63-74,
 wherein the dielectric body is formed of a glass comprising silicon oxide and the first optical window comprises silicon oxide; and
 wherein the vapor cell comprises a fired layer of glass frit bonding the first surface of the dielectric body to the surface of the first optical window, the fired layer of glass frit defining the first seal.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A vapor cell, comprising:
a dielectric body comprising a surface that defines an opening to a cavity in the dielectric body;
an adhesion layer on the surface of the dielectric body and surrounding the opening of the cavity, the adhesion layer having an exterior surface opposite the surface of the dielectric body and comprising silicon oxide;
a vapor or a source of the vapor in the cavity of the dielectric body; and
an optical window covering the opening of the cavity and having a surface bonded to the exterior surface of the adhesion layer to form a seal around the opening, the seal comprising metal-oxygen bonds formed by reacting a first plurality of hydroxyl ligands on the exterior surface of the adhesion layer with a second plurality of hydroxyl ligands on the surface of the optical window.

2. The vapor cell of claim 1, wherein the dielectric body is formed of silicon.

3. The vapor cell of claim 1, wherein the dielectric body is formed of a glass comprising silicon oxide.

4. The vapor cell of claim 1, wherein the metal-oxygen bonds comprise siloxane bonds.

5. The vapor cell of claim 1, wherein the optical window comprises silicon oxide.

6. The vapor cell of claim 1, wherein the vapor comprises a gas of alkali-metal atoms.

7. The vapor cell of claim 1, wherein the vapor comprises a noble gas.

8. The vapor cell of claim 1, wherein the vapor comprises a gas of diatomic halogen molecules.

9. The vapor cell of claim 1, wherein the vapor comprises a gas of organic molecules.

10. The vapor cell of claim 1,
wherein the source of the vapor resides in the cavity of the dielectric body; and
wherein the source of the vapor comprises a liquid or solid source of alkali-metal atoms configured to generate a gas of the alkali-metal atoms when heated.

11. The vapor cell of claim 1, wherein the surface of the dielectric body and the surface of the optical window have a surface roughness, $R_a$, no greater than 1 nm.

12. A vapor cell having at least two optical windows, the vapor cell comprising:
a dielectric body comprising:
a cavity in the dielectric body,
a first surface that defines a first opening to the cavity, and
a second surface that defines a second opening to the cavity;
an adhesion layer on the second surface of the dielectric body and surrounding the second opening of the cavity, the adhesion layer having an exterior surface opposite the second surface of the dielectric body and comprising silicon oxide;
a vapor or a source of the vapor in the cavity of the dielectric body;
a first optical window covering the first opening of the cavity and having a surface bonded to the first surface of the dielectric body to form a first seal around the first opening; and
a second optical window covering the second opening of the cavity and having a surface bonded to the exterior surface of the adhesion layer to form a second seal around the second opening, the second seal comprising metal-oxygen bonds formed by reacting a first plurality of hydroxyl ligands on the exterior surface of the adhesion layer with a second plurality of hydroxyl ligands on the surface of the second optical window.

13. The vapor cell of claim 12, wherein the dielectric body is formed of silicon.

14. The vapor cell of claim 12, wherein the dielectric body is formed of a glass comprising silicon oxide.

15. The vapor cell of claim 12, wherein the metal-oxygen bonds of the second seal comprise siloxane bonds.

16. The vapor cell of claim 12, wherein the first and second optical windows comprise silicon oxide.

17. The vapor cell of claim 12, wherein the vapor comprises a gas of alkali-metal atoms.

18. The vapor cell of claim 12, wherein the vapor comprises a noble gas.

19. The vapor cell of claim 12, wherein the vapor comprises a gas of diatomic halogen molecules.

20. The vapor cell of claim 12, wherein the vapor comprises a gas of organic molecules.

21. The vapor cell of claim 12,
wherein the source of the vapor resides in the cavity of the dielectric body; and
wherein the source of the vapor comprises a liquid or solid source of alkali-metal atoms configured to generate a gas of the alkali-metal atoms when heated.

22. The vapor cell of claim 12, wherein the second surface of the dielectric body and the surface of the second optical window have a surface roughness, $R_a$, no greater than 1 nm.

23. The vapor cell of claim 12,
wherein the first and second surfaces of the dielectric body are planar surfaces opposite each other; and
wherein the surface of the first optical window and the surface of second optical window are planar surfaces.

24. The vapor cell of claim 12, wherein the first seal comprises metal-oxygen bonds formed by reacting a third plurality of hydroxyl ligands on the first surface of the dielectric body with a fourth plurality of hydroxyl ligands on the surface of the first optical window.

25. The vapor cell of claim 12, wherein the dielectric body is formed of silicon and the first optical window comprises silicon oxide.

26. The vapor cell of claim 25, wherein the first seal comprises an anodic bond between the first surface of the dielectric body and the surface of the first optical window.

27. The vapor cell of claim 12,
wherein the dielectric body is formed of a glass comprising silicon oxide and the first optical window comprises silicon oxide;
wherein the vapor cell comprises a layer of silicon disposed between the first surface of the dielectric body and the surface of the first optical window; and
wherein the first seal comprises an anodic bond between the layer of silicon and one or both of the first surface of the dielectric body and the surface of the first optical window.

28. The vapor cell of claim 12,
wherein the dielectric body is formed of a glass comprising silicon oxide and the first optical window comprises silicon oxide; and
wherein the vapor cell comprises a fired layer of glass frit bonding the first surface of the dielectric body to the surface of the first optical window, the fired layer of glass frit defining the first seal.

* * * * *

UNITED STATES PATENT AND TRADEMARK OFFICE
CERTIFICATE OF CORRECTION

PATENT NO. : 10,859,981 B1
APPLICATION NO. : 16/659289
DATED : December 8, 2020
INVENTOR(S) : Jaime Ramirez-Serrano et al.

It is certified that error appears in the above-identified patent and that said Letters Patent is hereby corrected as shown below:

In the Specification

Column 4, Line 26, delete "104" and insert -- 102 -- therefor.

Column 4, Line 27, delete "104." and insert -- 102. -- therefor.

Column 8, Line 40, delete "506, 506" and insert -- 504, 506 -- therefor.

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*